US008301958B2

(12) United States Patent
Jijina et al.

(10) Patent No.: US 8,301,958 B2
(45) Date of Patent: *Oct. 30, 2012

(54) METHODS AND APPARATUS TO SELECT TORNADO ERROR CORRECTION PARAMETER

(75) Inventors: Aspandyar M. Jijina, Redondo Beach, CA (US); Charles Liu, Torrance, CA (US); Hans M. Hagberg, Redondo Beach, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 993 days.

This patent is subject to a terminal disclaimer.

(21) Appl. No.: 12/332,052

(22) Filed: Dec. 10, 2008

(65) Prior Publication Data

US 2009/0094501 A1    Apr. 9, 2009

Related U.S. Application Data

(63) Continuation of application No. 11/351,760, filed on Feb. 10, 2006, now Pat. No. 7,480,848.

(51) Int. Cl.
*H03M 13/00* (2006.01)

(52) U.S. Cl. ...................................................... 714/752

(58) Field of Classification Search .................... 714/752
See application file for complete search history.

(56) References Cited

U.S. PATENT DOCUMENTS

| 4,993,030 | A | * | 2/1991 | Krakauer et al. | 714/6.12 |
| 5,440,336 | A | * | 8/1995 | Buhro et al. | 725/93 |
| 5,832,000 | A | * | 11/1998 | Lin et al. | 714/755 |
| 6,307,487 | B1 | * | 10/2001 | Luby | 341/50 |
| 6,366,200 | B1 | * | 4/2002 | Aoki | 340/438 |
| 6,430,233 | B1 | * | 8/2002 | Dillon et al. | 375/316 |
| 6,502,139 | B1 | * | 12/2002 | Birk et al. | 709/233 |
| 6,567,948 | B2 | * | 5/2003 | Steele et al. | 714/746 |
| 6,609,119 | B1 | * | 8/2003 | Meghlaoui | 706/25 |
| 6,609,223 | B1 | | 8/2003 | Wolfgang | |
| 6,625,119 | B1 | | 9/2003 | Schuster et al. | |
| 6,677,864 | B2 | * | 1/2004 | Khayrallah | 341/50 |
| 6,678,855 | B1 | * | 1/2004 | Gemmell | 714/752 |
| 6,729,929 | B1 | * | 5/2004 | Sayers et al. | 455/446 |
| 6,742,023 | B1 | * | 5/2004 | Fanning et al. | 709/219 |
| 6,748,441 | B1 | * | 6/2004 | Gemmell | 709/231 |
| 6,772,337 | B1 | * | 8/2004 | Yener | 713/165 |
| 6,904,464 | B1 | * | 6/2005 | Van Langen et al. | 709/237 |
| 6,909,383 | B2 | * | 6/2005 | Shokrollahi et al. | 341/50 |
| 6,981,194 | B1 | * | 12/2005 | Pass | 714/752 |

(Continued)

OTHER PUBLICATIONS

Khisti, Ashish, *Tornado Codes and Luby Transform Codes*, Oct. 22, 2003.

(Continued)

*Primary Examiner* — Amine Riad

(57) ABSTRACT

Methods and apparatus to select Tornado forward error correction parameters for delivery systems are disclosed. A disclosed example system includes a transmitter station comprising a processor to select a Tornado error correction parameter based on an error correction configuration for a file and to indicate to a receiver the selected Tornado error correction parameter, and a Tornado error correction circuit to encode the file based on the selected Tornado error correction parameter.

20 Claims, 16 Drawing Sheets

U.S. PATENT DOCUMENTS

| | | | |
|---|---|---|---|
| 7,068,729 B2* | 6/2006 | Shokrollahi et al. | 375/296 |
| 7,072,971 B2* | 7/2006 | Lassen et al. | 709/230 |
| 7,095,729 B2* | 8/2006 | Sachs et al. | 370/341 |
| 7,139,960 B2* | 11/2006 | Shokrollahi | 714/752 |
| 7,174,385 B2* | 2/2007 | Li | 709/231 |
| 7,240,236 B2* | 7/2007 | Cutts et al. | 714/6.1 |
| 7,240,358 B2* | 7/2007 | Horn et al. | 725/87 |
| 7,382,737 B2* | 6/2008 | Matsugatani et al. | 370/253 |
| 7,480,848 B2* | 1/2009 | JiJina et al. | 714/774 |
| 2002/0080802 A1* | 6/2002 | Sachs et al. | 370/401 |
| 2003/0058958 A1* | 3/2003 | Shokrollahi et al. | 375/295 |
| 2004/0123211 A1* | 6/2004 | Kozintsev et al. | 714/749 |
| 2005/0076077 A1 | 4/2005 | Katayama | |
| 2005/0080916 A1 | 4/2005 | Katayama | |
| 2005/0125549 A1 | 6/2005 | Katayama | |

OTHER PUBLICATIONS

Khisti, Ashish, *Torndao Codes and Luby Transform Codes*, 6.454 PowerPoint Presentation, Oct. 22, 2003.

Luby, Michael, *LT Codes*, 43$^{rd}$ Annual IEEE Symposium on Foundations of Computer Science, 2002.

Luby et al., *Efficient Erasure Correcting Codes*, IEEE Transactions on Information Theory, vol. 47, No. 2, Feb. 2001, pp. 569-584.

Mitzenmacher, Michael, *Digital Fountains: A Survey and Look Forward*, Presentation Paper, Harvard University, 2004.

Mitzenmacher, Michael, *Tornado Codes with Applications to Reliable Multicast*, lecture presented at Duke University, Mar. 2, 1998.

Luby et al., *Practical Loss-Resilient Codes*, Proceedings of the 29$^{th}$ Symposium on Theory of Computing, 1997, pp. 150-159.

\* cited by examiner

| GRAPH ID 905 | GRAPH FILE 910 | CLIENT IDS 915 | QOS 917 | GRAPH DEPTH 920 |
|---|---|---|---|---|
| 810 | 805 | | | 3 |
| 811 | 805 | | | |
| 812 | 805 | | | |
| 821 | 820 | C | | |
| 822 | 820 | C | | |

COLUMN 1 445

| | NODE E 419 | |
|---|---|---|
| # NODES | # EDGES | LINKS |
| 3 | 4 | A,B,C,D |

925 — # NODES
930 — # EDGES
935 — LINKS

COLUMN 2 445

| | NODE J | |
|---|---|---|
| # NODES | # EDGES | LINKS |
| 2 | 3 | E,F,G |

| Number of Nodes Lost (node_block_size=2048b) During Outage Duration at Data Rate | | | | | |
|---|---|---|---|---|---|
| | | Outage Duration (seconds) | | | |
| | | 2 | 3 | 4 | 5 |
| DIRECTV Broadcast Data Rate (kbps) | 50 | 7 | 10 | 13 | 16 |
| | 100 | 13 | 19 | 25 | 31 |
| | 200 | 25 | 37 | 49 | 62 |
| | 400 | 49 | 74 | 98 | 123 |
| | 800 | 98 | 147 | 196 | 245 |
| | 1600 | 196 | 293 | 391 | 489 |
| | 2000 | 245 | 367 | 489 | 611 |

FIG. 10

| | | File Size (KB) [node_block_size=2048b] | | | | | | | |
|---|---|---|---|---|---|---|---|---|---|
| | | 10 | 20 | 40 | 80 | 160 | 320 | 640 | 1280 | 2560 |
| Outage Duration @ Specified Data Rate | 2secs@50kbps | 93% | 47% | 23% | 12% | 6% | 3% | 1% | 1% | 0% |
| | 3secs@50kbps | 100% | 67% | 33% | 17% | 8% | 4% | 2% | 1% | 1% |
| | 4secs@50kbps | 100% | 87% | 43% | 22% | 11% | 6% | 3% | 1% | 1% |
| | 5secs@50kbps | 100% | 100% | 53% | 27% | 14% | 7% | 3% | 2% | 1% |
| | 2secs@100kbps | 100% | 87% | 43% | 22% | 11% | 6% | 3% | 1% | 1% |
| | 3secs@100kbps | 100% | 100% | 63% | 32% | 16% | 8% | 4% | 2% | 1% |
| | 4secs@100kbps | 100% | 100% | 83% | 42% | 21% | 11% | 5% | 3% | 1% |
| | 5secs@100kbps | 100% | 100% | 100% | 52% | 26% | 13% | 7% | 3% | 2% |
| | 2secs@200kbps | 100% | 100% | 83% | 42% | 21% | 11% | 5% | 3% | 1% |
| | 3secs@200kbps | 100% | 100% | 100% | 62% | 31% | 16% | 8% | 4% | 2% |
| | 4secs@200kbps | 100% | 100% | 100% | 82% | 41% | 21% | 10% | 5% | 3% |
| | 5secs@200kbps | 100% | 100% | 100% | 100% | 52% | 26% | 13% | 7% | 3% |
| | 2secs@400kbps | 100% | 100% | 100% | 82% | 41% | 21% | 10% | 5% | 3% |
| | 3secs@400kbps | 100% | 100% | 100% | 100% | 62% | 31% | 16% | 8% | 4% |

FIG. 11

| Outage Duration @ Specified Data Rate | File Size (KB) | | | | | | | | |
|---|---|---|---|---|---|---|---|---|---|
| | 10 | 20 | 40 | 80 | 160 | 320 | 640 | 1280 | 2560 |
| 2secs@50kbps | 10.00% | 5.00% | 2.50% | 1.25% | 0.70% | 0.37% | 0.19% | 0.10% | 0.05% |
| 3secs@50kbps | - | 4.17% | 2.08% | 1.04% | 0.63% | 0.34% | 0.18% | 0.09% | 0.05% |
| 4secs@50kbps | - | 3.33% | 1.67% | 0.83% | 0.55% | 0.31% | 0.16% | 0.08% | 0.04% |
| 5secs@50kbps | - | - | 1.25% | 0.62% | 0.48% | 0.28% | 0.15% | 0.08% | 0.04% |
| 2secs@100kbps | - | 3.33% | 1.67% | 0.83% | 0.55% | 0.31% | 0.16% | 0.08% | 0.04% |
| 3secs@100kbps | - | - | 0.83% | 0.42% | 0.41% | 0.26% | 0.14% | 0.07% | 0.04% |
| 4secs@100kbps | - | - | - | - | 0.26% | 0.20% | 0.12% | 0.06% | 0.03% |
| 5secs@100kbps | - | - | - | (0.42%) | 0.12% | 0.14% | 0.09% | 0.05% | 0.03% |
| 2secs@200kbps | - | - | - | - | 0.26% | 0.20% | 0.12% | 0.06% | 0.03% |
| 3secs@200kbps | - | - | - | (0.83%) | (0.03%) | 0.09% | 0.07% | 0.04% | 0.02% |
| 4secs@200kbps | - | - | - | (1.67%) | (0.32%) | (0.03%) | 0.02% | 0.02% | 0.01% |
| 5secs@200kbps | - | - | - | - | 0.24% | 0.29% | 0.18% | 0.10% | 0.05% |
| 2secs@400kbps | - | - | - | (1.67%) | (0.32%) | (0.03%) | 0.02% | 0.02% | 0.01% |
| 3secs@400kbps | - | - | - | - | (0.05%) | 0.17% | 0.14% | 0.08% | 0.04% |

| FILE SIZE(KB) | | NODE SIZE (BYTES) | FILE SIZE INFLATION | NUMBER BLOCKS | NODE OVERHEAD |
| --- | --- | --- | --- | --- | --- |
| MIN (>=) | MAX (<) | | | | |
| 0 | 2 | NO TOR. | NO TOR. | NO TOR. | NO TOR. |
| 2 | 4 | NO TOR. | NO TOR. | NO TOR. | NO TOR. |
| 4 | 8 | NO TOR. | NO TOR. | NO TOR. | NO TOR. |
| 8 | 16 | NO TOR. | NO TOR. | NO TOR. | NO TOR. |
| 16 | 32 | NO TOR. | NO TOR. | NO TOR. | NO TOR. |
| 32 | 64 | NO TOR. | NO TOR. | NO TOR. | NO TOR. |
| 64 | 128 | NO TOR. | NO TOR. | NO TOR. | NO TOR. |
| 128 | 256 | 16 | 1 | 4 | 1.3 |
| 256 | 512 | 16 | 1 | 8 | 1.3 |
| 512 | 1024 | 32 | 1 | 8 | 1.2 |
| 1024 | 2048 | 32 | 1 | 16 | 1.2 |
| 2048 | 4096 | 64 | 1 | 16 | 1.1 |
| 4096 | 8192 | 64 | 1 | 32 | 1.1 |
| 8192 | 16384 | 128 | 1 | 32 | 1 |
| 16384 | 32768 | 128 | 1 | 64 | 1 |

METHODS AND APPARATUS TO SELECT TORNADO ERROR CORRECTION PARAMETER

FIELD OF THE DISCLOSURE

This disclosure relates generally to communication systems and/or networks and, more particularly, to methods and apparatus to select Tornado error correction parameters for data delivery in communication systems and/or networks.

BACKGROUND

In communication systems and/or networks, data is delivered from a transmitting station to a receiving station via a communications path and/or channel. Due to, for example, noise and/or interference present on the communication path and/or channel, the communications path and/or channel has a non-zero probability of, for instance, introducing an error into or loss of any given portion (e.g., packet, block, etc.) of received data. In many communication systems and/or networks some form of error correction is utilized that allows the receiving station to detect and/or correct one or more introduced errors and/or recover lost data. For example, a communication system and/or network may employ systematic forward error correction (FEC) that transmits a finite set of original data symbols (e.g., bytes, bits, etc.) together with a finite sequence of check and/or redundancy symbols (i.e., additional symbols) that are, generally, computed from the finite set of original data symbols. The original data symbols and the additional symbols are collectively referred to as an error correction codeword. The number of additional symbols determines the number of introduced errors and/or lost data that may be detected, corrected and/or recovered by the receiving station. While the inclusion of the additional symbols reduces the instantaneous throughout of a system and/or network, its inclusion increases the overall throughput by allowing some errors to be corrected and/or recovered and, thus, may eliminate the need for retransmission of data.

FEC may be implemented using any of a variety of techniques, for example, Reed-Solomon codes, Tornado codes, Low Density Parity Check (LDPC), Cyclic Redundancy Check (CRC), etc. Additionally, FEC may be implemented using any set of parameters. For example, FEC may be applied with different amounts of redundancy (e.g., the number of additional transmitted symbols computed from the original data), with different block sizes (e.g., the number of original data symbols per codeword), different methods of computing the additional symbols from the original data (e.g., different polynomials), utilization of interleaving, etc. The selection of the FEC technique and/or parameters may depend upon the characteristics of, for example, one or more of a particular communication service being provided (e.g., data rate), a type of communication path and/or channel (e.g., wireless, wired, satellite, etc.), a type and/or amount of noise and/or interference, etc. Further, FEC decoding may be implemented using any of a variety of techniques. For example, using erasure decoding, etc.

BRIEF DESCRIPTION OF THE DRAWINGS

FIG. 9 illustrates an example Tornado error correction table.

FIG. 10 illustrates an example table of nodes lost as a function of outage duration and broadcast data rate.

FIG. 11 illustrates an example table of Quality of Service as a function of file size, outage duration and broadcast data rate.

FIG. 12 illustrates and example table of Quality of Service variation as a function of node_block_size, file size, outage duration and broadcast data rate.

FIG. 14 illustrates an example table used to select node_block_size.

DETAILED DESCRIPTION

While the following disclosure is made with respect to example DIRECTV® broadcast services and systems, it should be understood that many other delivery systems are readily applicable to disclosed methods and apparatus. Such systems include other wireless distribution systems, wired or cable distribution systems, Ultra High Frequency (UHF)/ Very High Frequency (VHF) radio frequency systems or other terrestrial broadcast systems (e.g., Multi-channel Multi-point Distribution System (MMDS), Local Multi-point Distribution System (LMDS), etc.), and fiber optic networks.

Figure 1:
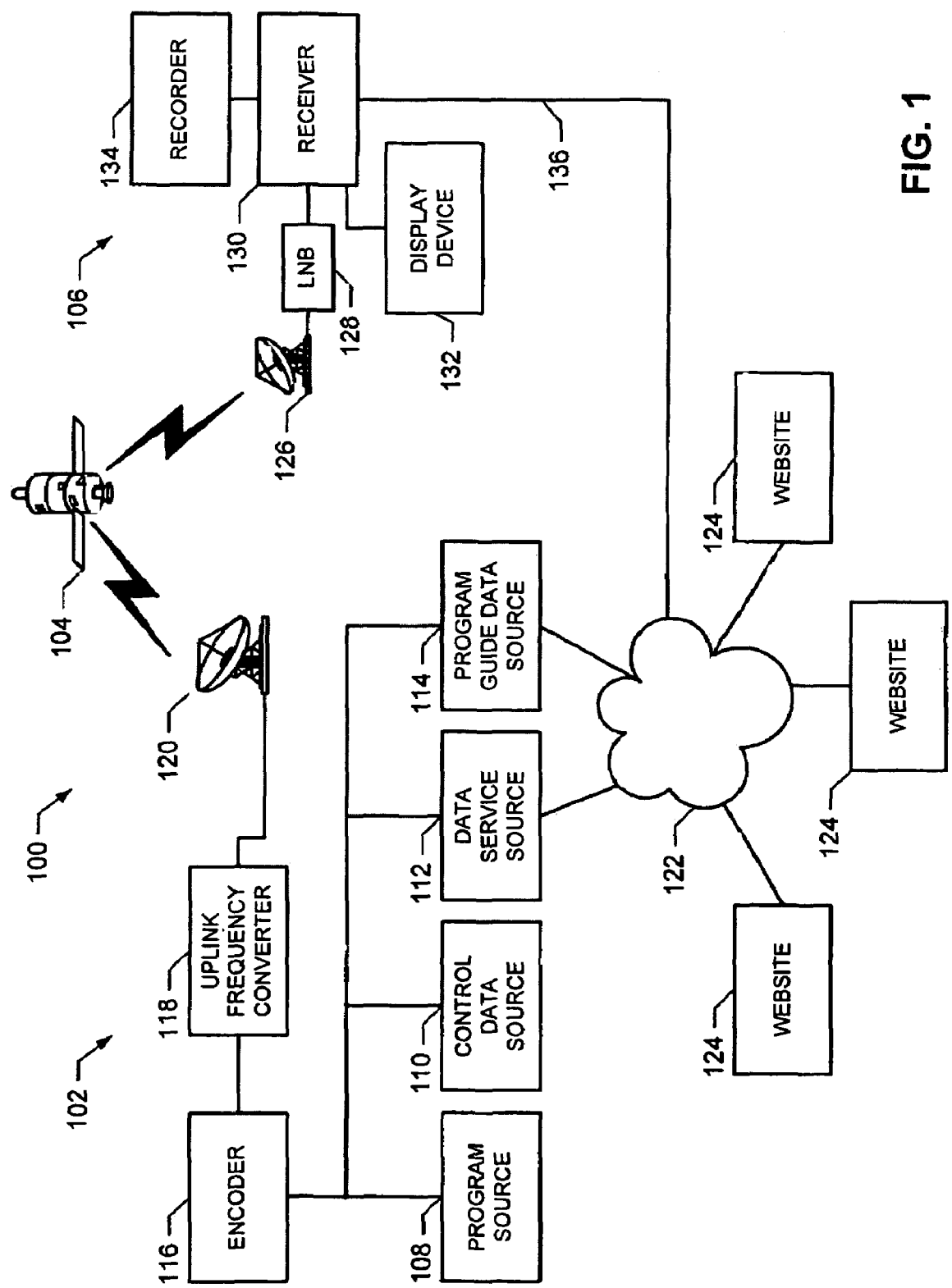
FIG. 1 is a schematic illustration of an example satellite broadcast system.

As illustrated in FIG. 1, an example direct-to-home (DTH) system 100 generally includes a transmission station 102, a satellite/relay 104 and a plurality of receiver stations, one of which is shown at reference numeral 106, between which wireless communications are exchanged. The wireless communications may take place at any suitable frequency, such as, for example, Ku-band frequencies. As described in detail below with respect to each portion of the system 100, information from the transmission station 102 is transmitted to the satellite/relay 104, which may be at least one geosynchronous or geo-stationary satellite that, in turn, rebroadcasts the information over broad geographical areas on the earth that include receiver stations 106. To facilitate backchannel communications, the receiver stations 106 may be communicatively coupled to the transmission station 102 via, for example, a terrestrial communication link, such as a telephone line and/or an Internet connection 136.

In further detail, the example transmission station 102 of the example system of FIG. 1 includes a plurality of sources of data and/or information (e.g., program sources 108, a control data source 110, a data service source 112, and one or more program guide data sources 114). During operation, information (e.g., files, bitstreams, etc.) from one or more of these sources 108-114 passes to an encoder 116, which encodes the information (e.g., files) for broadcast to the satellite/relay 104. Encoding includes, for example, applying Tornado error correction (EC) encoding and then converting the thus protected information into data streams that are, among other things, forward error correction (FEC) encoded and multiplexed into a packetized data stream or bitstream using any of a variety of algorithms. A header is attached to each data packet within the packetized data stream to facilitate identification of the contents of the data packet. The header also includes a service channel identifier (SCID) that identifies the data packet. This data packet is then encrypted. As will be readily appreciated by those having ordinary skill in the art, a SCID is one particular example of a program identifier (PID).

To facilitate the broadcast of information, the encoded information passes from the encoder 116 to an uplink frequency converter 118 that modulates a carrier wave with the encoded information and passes the modulated carrier wave to an uplink antenna 120, which broadcasts the information to the satellite/relay 104. Using any of a variety of techniques, the encoded bitstream is modulated and sent through the uplink frequency converter 118, which converts the modulated encoded bitstream to a frequency band suitable for reception by the satellite/relay 104. The modulated, encoded bitstream is then routed from the uplink frequency converter 118 to the uplink antenna 120 where it is broadcast toward the satellite/relay 104.

The programming sources 108 receive software downloads and/or video and/or audio programming from a number of sources, including satellites, terrestrial fiber optics, cable, or tape. The video and/or audio programming may include, but is not limited to, television programming, movies, sporting events, news, music or any other desirable content. The programming sources 108 may provide the software downloads and/or the video and/or audio programming in the form of, for example, a streaming bitstream, a file, etc.

Like the programming sources 108, the control data source 110 passes control data to the encoder 116. Control data may include data representative of a list of SCIDs to be used during the encoding process, or any other suitable information.

The data service source 112 receives data service information and web pages made up of data files, text files, graphics, audio, video, software, etc. Such information may be provided via a network 122. In practice, the network 122 may be the Internet, a local area network (LAN), a wide area network (WAN) or a conventional public switched telephone network (PSTN). The information received from various sources is compiled by the data service source 112 and provided to the encoder 116. For example, the data service source 112 may request and receive information from one or more websites 124. The information from the websites 124 may be related to the program information provided to the encoder 116 by the program sources 108, thereby providing additional data related to programming content that may be displayed to a user at the receiver station 106.

The program guide data source 114 compiles information related to the SCIDs used by the encoder 116 to encode the data that is broadcast. For example, the program guide data source 114 includes information that the receiver stations 106 use to generate and display a program guide to a person (i.e., a user), wherein the program guide may be a grid guide that informs the user of particular programs that are available on particular channels at particular times. The program guide also includes information that the receiver stations 106 use to assemble programming for display to the user. For example, if the user desires to watch a baseball game on his or her receiver station 106, the user will tune to a channel on which the game is offered. As described in detail below, the receiver station 106 gathers the SCIDs related to the game, wherein the program guide data source 114 has previously provided to the receiver station 106 a list of SCIDs that correspond to the game.

The satellite/relay 104 receives the modulated, encoded Ku-band bitstream and re-broadcasts it downward toward an area on earth that includes the receiver station 106. In the illustrated example of FIG. 1, the example receiver station 106 includes a reception antenna 126 connected to a low-noise-block (LNB) 128 that is further connected to a receiver 130. As described in conjunction with FIGS. 2 and 3 below, the receiver 130 may be a set-top box or may be a personal computer (PC) having a receiver card installed therein. A display device 132, such as, for example, a television set or a computer monitor, is coupled to the receiver 130 for displaying received programming to a user. Additionally, the example receiver station 106 may include a recorder 134 used to record programming received by the receiver station 106. The recorder 134 may be, for example, a device capable of recording information on media, such as videotape or digital media such as a hard disk drive, a digital versatile disk (DVD), a compact disk (CD) and/or any other suitable media.

Although not necessary for proper operation of the example system of FIG. 1, the receiver station 106 may optionally incorporate a connection 136 (e.g., Ethernet circuit or modem for communicating over the Internet) to the network 122 for transmitting requests and other data back to the transmission station 102 (or a device managing the transmission station 102 and overall flow of data in the example system 100) and for communicating with websites 124 to obtain information therefrom.

The example system of FIG. 1 is capable to deliver, among other things, a file via the uplink antenna 120, which broadcasts the information via the satellite/relay 104 to the receiver stations (e.g., the receiver station 106). The file may contain, for example, audio or video program data, control data, data service information or web pages, or program guide information. In the example system the delivery of a file comprises three functions: (a) binding network addresses to logical data channels, (b) announcing the file and (c) delivering the file. The binding of network addresses to hardware locations allows for files to be sent and received via ubiquitous network addresses, for example, an Internet Protocol (IP) address and port number. Announcing the delivery of the file, allows the receiver station 106 to rendezvous with a file broadcast at a pre-determined time at the network address to download the file. In particular, announcements describe, in advance, when and how individual files will be delivered. They contain sufficient information about these files to allow the receiver stations 106 to determine whether or not to download one or more of the files. As discussed below, part of the information contained in an announcement may comprise Tornado EC parameters. Delivery of the file comprises segmenting the file into sections and transmitting each section with appropriate header information as, for example, a broadcast file download protocol (BFDP) datagram that occupies the payload portions of one or more Universal Datagram Protocol (UDP)/IP datagrams via the uplink antenna 120 and the satellite/relay 104.

To download a file, the receiver station 106 joins an IP multicast group at an address and pre-determined time specified in an announcement. The receiver station 106 re-assembles the data file from the BFDP datagrams transmitted to the IP multicast group as received via the reception antenna 126.

As discussed below, in addition to the use of data files to transport programming information, audio and video information, web pages, software downloads, etc., the example system of FIG. 1 uses data files to transport Tornado EC graph files for use in the subsequent reception of transmitted data files.

In operation of the receiver station 106, the reception antenna 126 receives signals including a bitstream from the satellite 104. The signals are coupled from the reception antenna 126 to the LNB 128, which amplifies and, optionally, downconverts the received signals. The LNB output is then provided to the receiver 130, which, as described in detail below, receives, de-packetizes, de-multiplexes and decodes the received signal to provide audio and video signals to the display device 132 and/or the recorder 134. The receiver 130 is responsive to user inputs to tune to a particular program, by selecting and decoding a particular frequency and the particular SCIDs on which the desired program is located.

Figure 2:
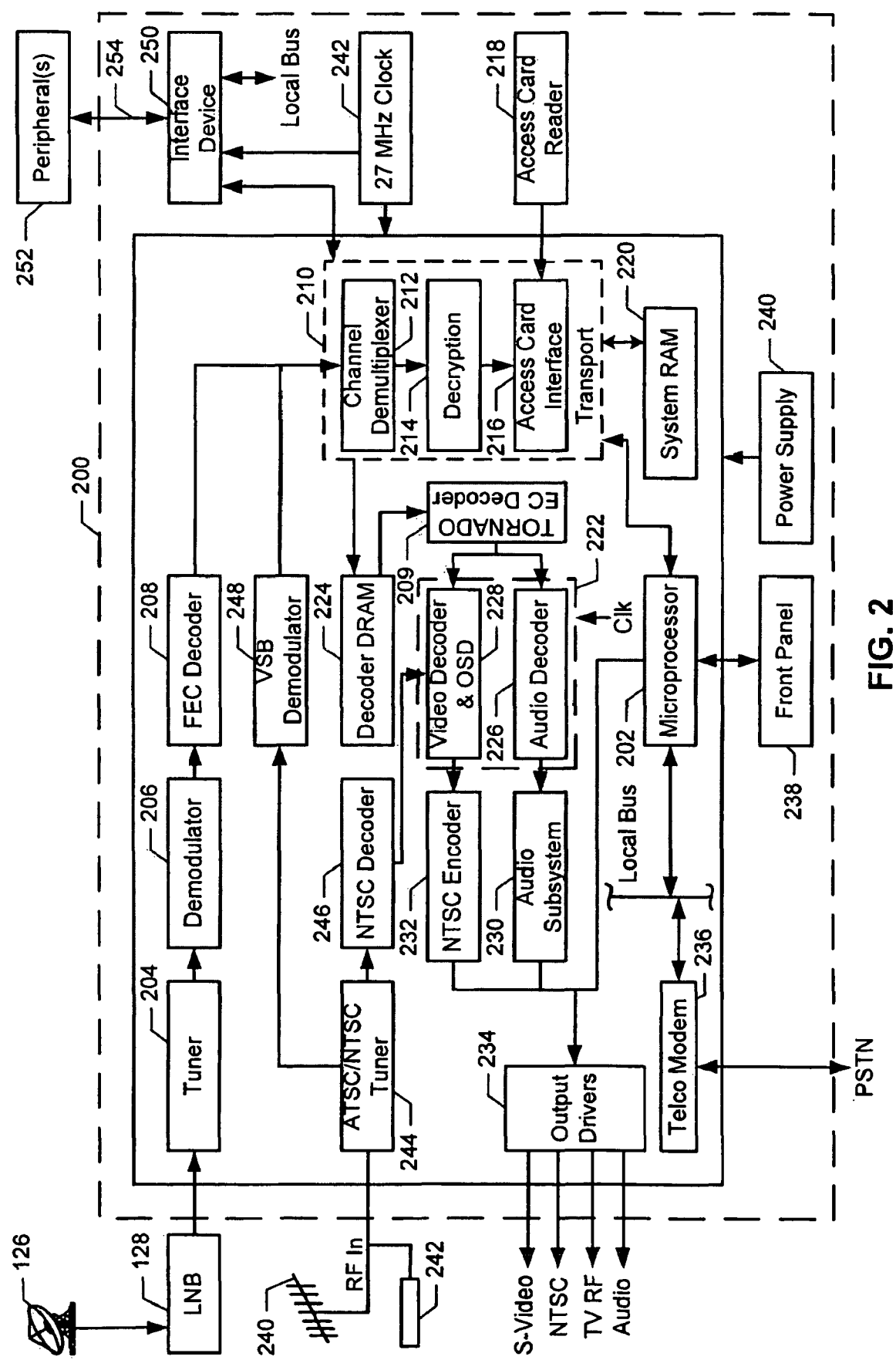
FIGS. 2 and 3 are schematic illustrations of example manners of implementing the receiver of FIG. 1.

FIG. 2 is an illustration of an example manner of implementing the receiver 130 of FIG. 1. In general, front-end circuitry inside the example receiver 200 of FIG. 2 receives the L-band Radio Frequency (RF) signals from the LNB 128 and converts the signals back into the original digital data stream. Decoding circuitry, receives the original data stream and performs video/audio processing operations such as de-multiplexing and decompression. A processor, microprocessor or central processing unit (CPU) 202 controls the overall operation of the receiver 130, including the selection of parameters (e.g., Tornado EC parameters and/or graphs), the set-up and control of components, channel selection, and many other functions.

Specifically, the example receiver 200 of FIG. 2 includes a tuner 204, a demodulator 206, a forward-error-correction (FEC) decoder 208, a Tornado EC decoder circuit 209, a transport circuit 210, a channel de-multiplexer 212, a decryption circuit 214, an access card interface 216, an access card reader 218, a memory device 220 containing, for example, Tornado graph data, an audio/video decoder circuit 222 having a random access memory (RAM) 224, an audio decoder 226, a video decoder 228, an audio subsystem 230, an National Television System Committee (NTSC) (or other) encoder 232, output drivers 234, a modem connection 236, a front panel user interface 238, and a power supply 240, coupled together as illustrated. As further shown in FIG. 2, a 27 megahertz (MHz) clock signal generator 242 is also provided. The clock generator 242 generates a clock signal (CK) that is coupled to the audio/video decoder circuit 232 and that is frequency-calibrated by a signal received from the transport circuit 210, as shown.

The transport circuit 210 receives the transport stream of digitized data packets containing video, audio, data, scheduling information, data files, and other information from the FEC decoder 208. The digital packet information contains identifying headers as part of its overhead data. Under control of the microprocessor 202, the channel de-multiplexer 212 filters out packets that are not currently of interest, and routes the data packets that are of interest through the decryption circuit 214 and, in the case of some packets, also through the access control circuits 216, 218 to their proper downstream destination. The decryption circuit 214 provides decryption for the data packets that have been encrypted. The access control circuits 216, 218 provide access control by any of a variety of techniques. For example, access control may be achieved by requiring a data packet to have a proper authorization code in order to be passed to the decryptor 214 and/or video decoder 228. The access card reader 218 can interface with an access card (not shown) that receives the packet authorization code, determines its validity, and generates a code that confirms to the transport 210 that the subject data packet is authorized.

The authorized data of interest, which now consists of the payload portions of the received data packets, are forwarded to decoder dynamic RAM (DRAM) 224 for buffering and may optionally be intermediately stored in the memory device 220. Using, among other things, a Tornado graph and a node_block_size, the Tornado EC decoder 209 decodes data files received by the transport circuit 210 and stored in the DRAM 224 to correct for one or more introduced errors and/or recover lost data. In the illustrated example of FIG. 2, the Tornado EC decoder 209 processes and/or corrects received data files stored in the DRAM 224 and/or the memory device 220, and the FEC decoder 208 processes and/or corrects data packets received from demodulator 206.

The audio/video decoder 222 decodes the payloads stored in DRAM 224, as needed. Alternatively, the requested data is routed from the memory device 220 through the transport 210 to the audio/video decoder 222. At that time, the data is routed to the video decoder 228 (which includes display generating circuitry) and the NTSC (or other) encoder 232. If the data was Tornado EC encoded by Encoder 116 (FIG. 1), the data is first passed through the Tornado EC decoder 209 for processing and/or correction. The video decoder 228 reads in the compressed video data from the DRAM 224, or optionally, from the Tornado EC decoder 209, parses it, creates quantized frequency domain coefficients, then performs an inverse quantization, inverse discrete cosine transform (DCT) and motion compensation. At this point, an image is reconstructed in the spatial domain. This image is then stored in a frame buffer in the DRAM 224. At a later time, the image is read out of the frame buffer in DRAM 224 and passed through the display circuitry to the encoder 232. The display circuitry (located in the video decoder 228) generates graphics that allow an electronic program guide to be displayed. The encoder 232 may convert the digital video signals to, for example, an analog signal according to the NTSC standard or to another desired output protocol (e.g., a protocol defined by the Advanced Television Systems Committee (ATSC)), thereby allowing video to be received by the display device 132. Alternatively, the requested data, stored in the memory device 220, may be processed and/or corrected by the Tornado EC decoder 209 and/or used by the microprocessor 202 to, for instance, configure the receiver (e.g., software downloads and/or updates), present program guide information, receive and/or determine Tornado EC parameters and/or graphs, etc.

As shown in FIG. 2, an antenna 240 and/or a cable line 242 may be coupled to the receiver 200 to provide information content from cable or terrestrial broadcast systems (not shown). The signals from the antenna 240 and/or the cable line 242 are coupled to both the output drivers 234 and an ATSC/NTSC tuner 244. The output of the tuner 244 is coupled to an NTSC decoder 246 and to a vestigial side band (VSB) demodulator 248. The output from the decoder 246 is coupled to the decoder 222 and the output of the demodulator 248 is coupled to the transport 210. Additionally, the receiver 200 may include an interface device 250 that receives the clock signal and that is coupled to the local bus of the microprocessor 202. The interface device 250 may be used to provide connectivity to one or more peripherals 252 via a bus 254.

Figure 3:
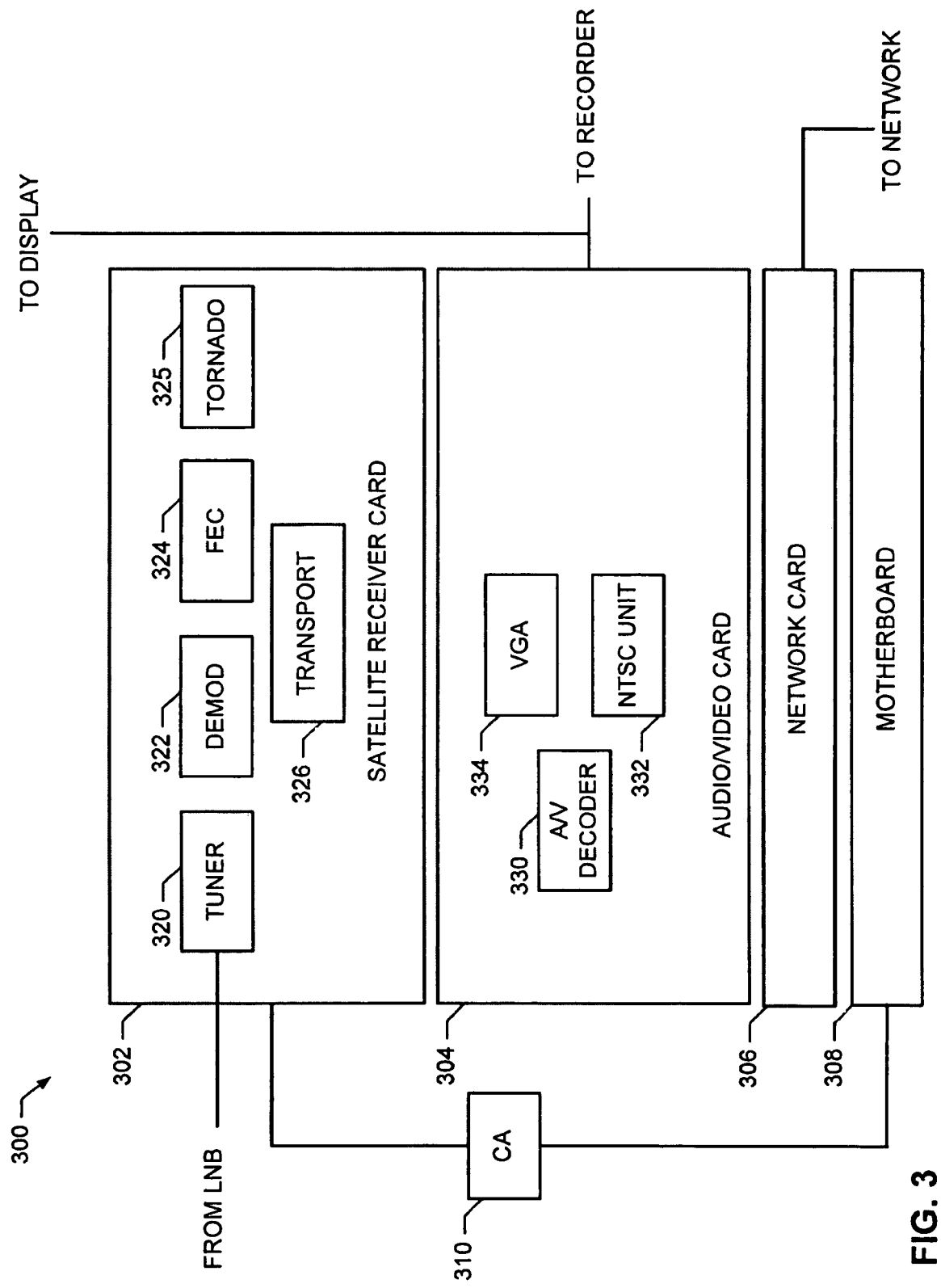

FIG. 3 is a detailed illustration of a second example receiver 300 having a personal computer (PC) based architecture, it being understood that the receiver 300 could be used as the receiver station 130 of FIG. 1. As shown, the receiver 300, which receives an input from the LNB 128, includes a satellite receiver card 302, an audio/video card 304 and a network card 306, each of which may be coupled to a motherboard 308. The video/audio decoder card 320 could, of course, be integrated with the satellite receiver card 302. The receiver station 300 also includes a conditional access module 310 and a mass memory such as a hard disk (not shown).

In one example, the satellite receiver card 302 includes a tuner 320, a demodulator 322, a FEC decoder 324, a Tornado EC decoder 325 and a transport functional processing block 326. The implementation and/or interconnection of these devices are substantially the same as shown and described in conjunction with FIG. 2 and, thus, in the interest of brevity will not be repeated here. The interested reader is referred to the discussion above in connection with FIG. 2.

The audio/video decoder card 304 includes an audio/video decoder 330, an optional NTSC output driver 332 and a video graphics adapter (VGA) output driver 334. As described below in detail, the satellite receiver card 302 and the audio/video card 304 receive and decode the signal received from the LNB 126.

In operation, an incoming signal from the LNB 128 is received by the satellite receiver card 302 and passed through a series of initial processing operations including the tuner 320, the demodulator 322 and the forward error correction decoder 324, before passing to the transport functional processing block 326. Although the functional circuits within the transport functional processing block 326 are not illustrated, they are identical to the channel de-multiplexing, decryption, and access determination circuit blocks of a standard transport decoder, as described in conjunction with FIG. 2. For example, the transport functional processing block 326 receives the transport stream or bitstream of digitized data packets containing video, audio, scheduling information, and other data. The digital packet information contains identifying headers as part of its overhead data. Under control of a main processor/controller (typically located on the motherboard 308), the transport functional processing block 326 filters out received data packets that are not currently of interest. Received data packets that are of interest are routed through decryption and access control operations within the conditional access module 310. Access control may be provided by any known means, such as, for example, by requiring a data packet to have a proper authorization code in order to be passed to the audio/video decoder card 304.

The transport functional processing block 326 passes the data to the audio/video decoder 330 of the video/audio decoder card 304. The authorized data of interest are stored in system RAM (not shown) for buffering, and the video/audio decoder 330 retrieves the data from RAM as needed.

For video data, the audio/video decoder 330 reads in the compressed video data from its RAM, parses it, creates quantized frequency domain coefficients, then performs an inverse quantization, inverse DCT and motion compensation. At this point, an image has been reconstructed in the spatial domain. This image is then stored in a frame buffer in the video decoder's RAM. At a later time, the image is read out of the frame buffer and passed through the display circuitry to the VGA output driver 334 and optionally, to the NTSC and/or ATSC output driver 332, the output of which is coupled to the display device 132 and/or the recorder 134. The display circuitry also generates graphics and text for a graphical user interface (GUI), such as an electronic program guide, to be displayed.

For control and/or configuration data (e.g., Tornado EC graph files), the motherboard 308 may further process and/or receive, as described below, data and/or data files received and/or processed by the transport functional processing block 326.

Although not shown, any one or more of the cards 302-308 may include one or more processors to execute machine readable instructions that may be used to implement the example methods, processes, apparatus, and/or systems described herein. Also, the allocation of memory and control functions may be arbitrarily divided between the cards 302-308 of the system 300. Thus, a substantial amount, or possibly all, of the control and memory functions for operation of the disclosed system may be integrated within a single card, or alternatively, may be incorporated within the PC motherboard 308.

Although the example receivers 200 and 300 depicted in FIGS. 2 and 3 are shown as having a plurality of devices that are interconnected or communicatively coupled with other devices, such interconnections are illustrated by way of example and should not be construed as limiting the manner in which the devices can be interconnected to implement the example methods, apparatus, and/or systems described herein. On the contrary, the devices described above in connection with the receivers 200 and 300 may be interconnected in any other suitable manner to implement the example methods, apparatus, and/or systems.

Figure 4:
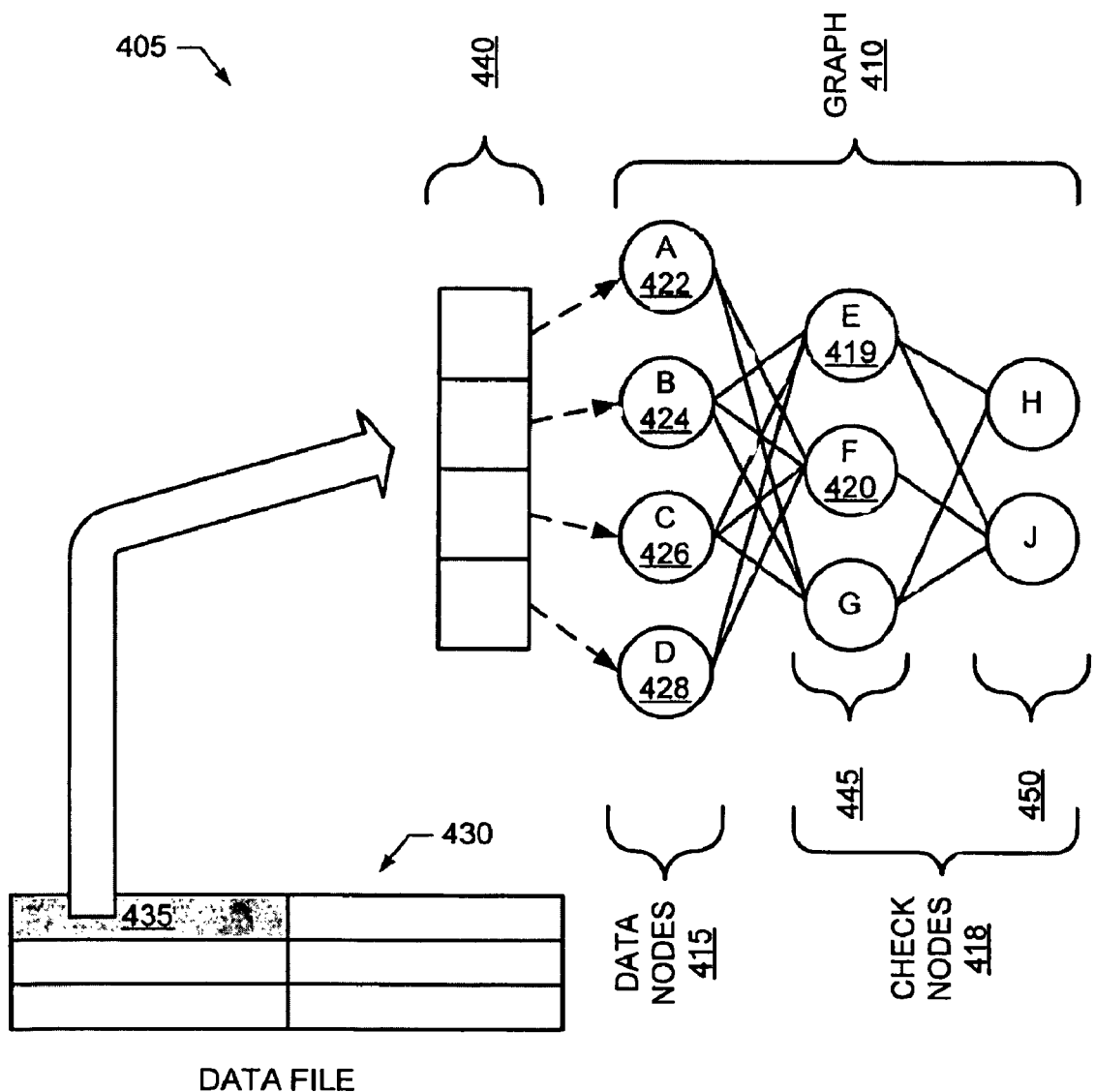
FIG. 4 illustrates an example manner of implementing a Tornado error correction (EC) encoder.

FIG. 4 illustrates an example manner of implementing a Tornado EC encoder 405. As illustrated, the Tornado EC encoder 405 is based on an example Tornado graph 410 that consists of j columns of nodes (i.e., a Tornado graph depth of j). The left-hand most column of nodes 415 includes an original set of data symbols being transmitted. The remaining j−1 columns of nodes 418 include the check and/or redundancy symbols (i.e., the additional symbols). Each node of the example graph 410 represents node_block_size bytes. The additional symbol nodes in each of the other columns 418 (e.g., column n) are calculated using exclusive-OR (i.e., XOR) operations of nodes in the left-hand adjacent column (e.g., column n−1). In particular, in the example Tornado graph 410, the links between the nodes of column n and the nodes of column n−1 define which nodes in column n−1 are XOR'd to calculate the value of the nodes of column n. For example, in the illustrated example graph 410, the node F 420 is computed as an XOR of the values of node A 422, node B 424, node C 426 and node D 428. In particular, the value of node F 420 in the example graph 405 can be expressed mathematically as shown in EQN. 1. The value of other nodes may be similarly represented. Alternative Tornado graphs and graph topologies abound.

$$F = A \oplus B \oplus C \oplus D \qquad \text{EQN. 1}$$

Tornado EC encoding of a data file 430 may, for example, be performed by segmenting the data file 430 into data blocks. Each data block (e.g., a data block 435) is equally partitioned into a set of num_symbols data symbols 440 that are placed in the left-hand most column 415, where each of the symbols 440 is comprised of node_block_size bytes and, thus, each data block comprises num_symbols*node_block_size bytes. The check nodes in the $2^{nd}$ column 445 are calculated by XOR'ing the data nodes in the $1^{st}$ column 415. Likewise, the remaining columns of check nodes (e.g., the column 450) are computed by XOR'ing the data in the left-hand adjacent column (e.g., the column 445). After all the check node columns 418 are computed, the num_symbols data symbols 440 and the symbols from the check node columns 418 are placed into an output buffer (i.e., the output buffer contains the value of all of the nodes of the Tornado graph 405). Likewise, all other data blocks of the data file 430 are processed until the entire data file 430 has been processed. Upon completion of the processing of the data file 430 the output buffer will contain x*num_symbols data symbols and x*n check symbols, where x is the number of data blocks in the data file 430 (i.e., x=ceiling[file_size/(num_symbols*node_block_size)] and n is the number of nodes in the check columns (e.g., the columns 445 and 450). The output buffer can then be transmitted via a communication path and/or channel, possibly after a deterministic or random reordering, to a receiving device.

As discussed above, due to noise and/or interference present on the communication path and/or channel, the receiver may not receive all the transmitted symbols. For example, the receiver may receive only x*(num_symbols+n)-e symbols, where e is a number of data and/or check symbols lost and/or corrupted during transmission and/or reception. To recover and/or correct these lost and/or corrupted e symbols, the receiver using any of a variety of techniques sorts the data symbols and/or check symbols into respective data blocks. Then, using any of a variety of Tornado EC decoding techniques and the Tornado graph 410 and/or parameters used to encode the file, the receiver calculates any missing and/or corrupted data and/or check symbols. Example realizations of Tornado EC decoding techniques are well known to persons of ordinary skill in the art and, in the interest of brevity, will not be discussed in further detail. In general, Tornado EC decoding ends when either all transmitted data symbols have been recovered and/or corrected indicating that decoding was successful or when a decoding process completes without recovering and/or correcting one or more data symbols.

A Tornado graph may have any of a variety of parameters and/or any of a variety of configurations. For example, in the example DTH system 100 of FIG. 1, a Tornado graph has the following properties: (a) a Tornado graph of depth j is represented using j+4 columns; (b) columns 2 through j+2 are linked with their respective left-hand adjacent column; (c) there are no links between column j+2 and j+3; (d) the nodes of column j+3 are a copy of the respective nodes of column j+1; (e) column j+4 is only linked to column j+3; (f) the links between columns j+1 and j+2 are different from the links between j+3 and j+4; and (g) at least 512 nodes per column. It will be apparent to persons of ordinary skill in the art that other example Tornado graph topologies abound and may alternatively be implemented and/or utilized with the Tornado graph selection and parameter determination methods and apparatus disclosed herein.

Figure 5:
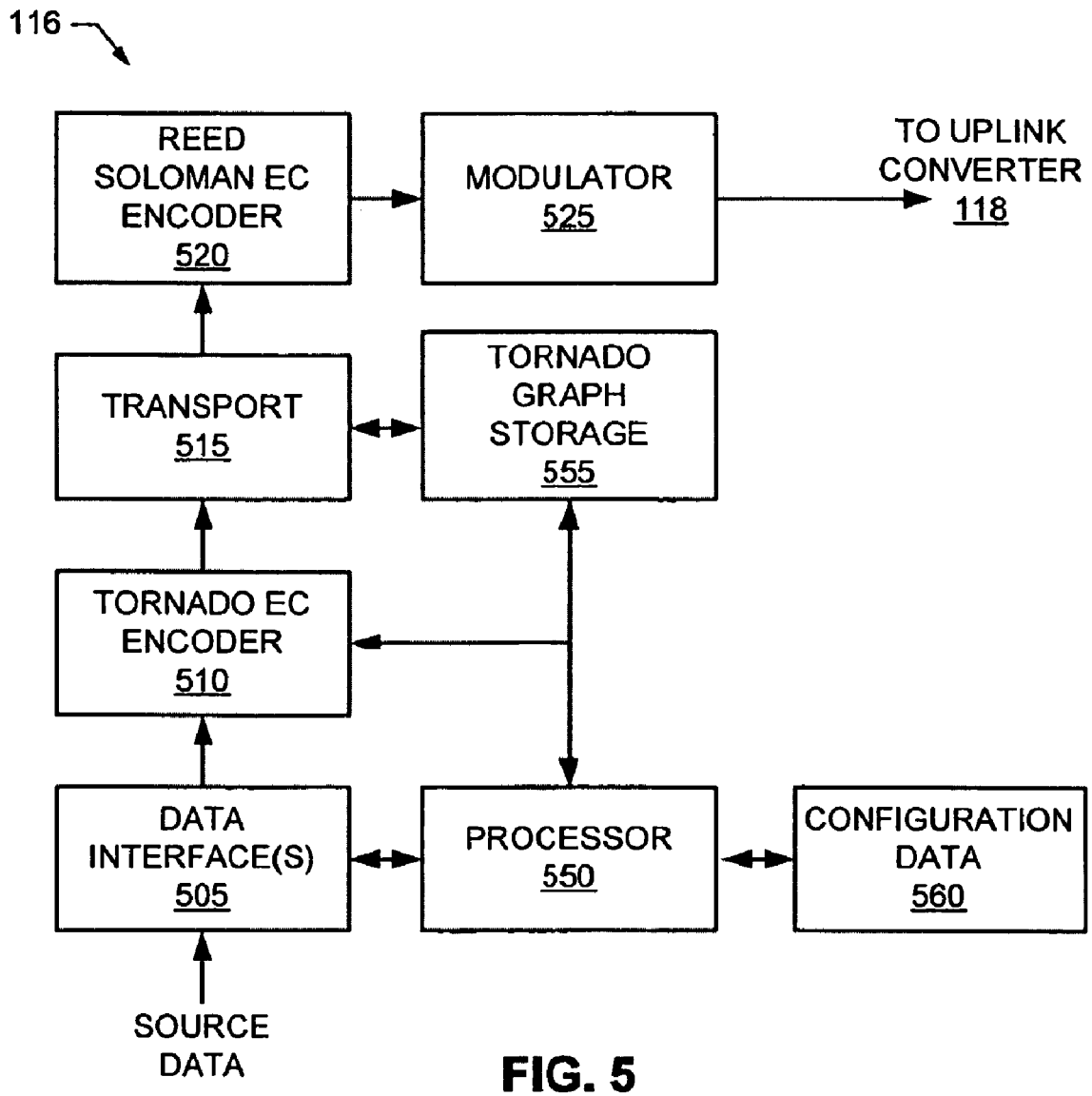
FIG. 5 is a schematic illustration of an example manner of implementing the encoder of FIG. 1

FIG. 5 illustrates an example manner of implementing the encoder 116 of FIG. 1. To interface with and/or to receive source data (e.g., video and audio programming, control data, data service information and web page data or program guide data) from, for example, the program source 108, the control data source 110, the data service source 112, the program data guide source 114, the example encoder 116 of FIG. 5 includes a data interface(s) 505. In one example, the encoder 116 of FIG. 5 includes a transport processing block 515, a Tornado EC encoder 510, an Reed-Solomon EC encoder 520, and a modulator 525. The implementation and/or interconnection of these devices are substantially the same as shown and described in conjunction with FIGS. 2 and 3 and, thus, in the interest of brevity will not be repeated here. The interested reader is referred to the discussion above in connection with FIGS. 2 and 3.

To, among other things, control and/or configure the Tornado EC encoder 510, the illustrated example of FIG. 5 includes a processor 550. The processor 550 uses configuration data 560 that may be, for example, stored in a volatile and/or non-volatile memory associated with and/or attached to the encoder 116. For example, the configuration data 560 contains parameters and/or selection rules, described in more detail below, that the processor 550 uses to select and/or determine Tornado EC encoding parameters and/or a Tornado EC graph. The selection and usage of Tornado EC encoding parameters and/or a Tornado EC graph are discussed below in connection with FIGS. 6, 7, 14 and 15. The processor 550 may also create and transmit Tornado graph files to the receivers 106. The usage of Tornado graph files by the receivers 106 are discussed below in connection with FIGS. 7 and 8A-8D.

To store a plurality of Tornado graphs for selection by the processor 550 and/or use by the Tornado EC encoder 510 during the transmission of a data file, the example encoder 116 of FIG. 5 includes Tornado graph storage 555. The example Tornado graph storage 555 is discussed below in connection with FIG. 9.

Figure 6:
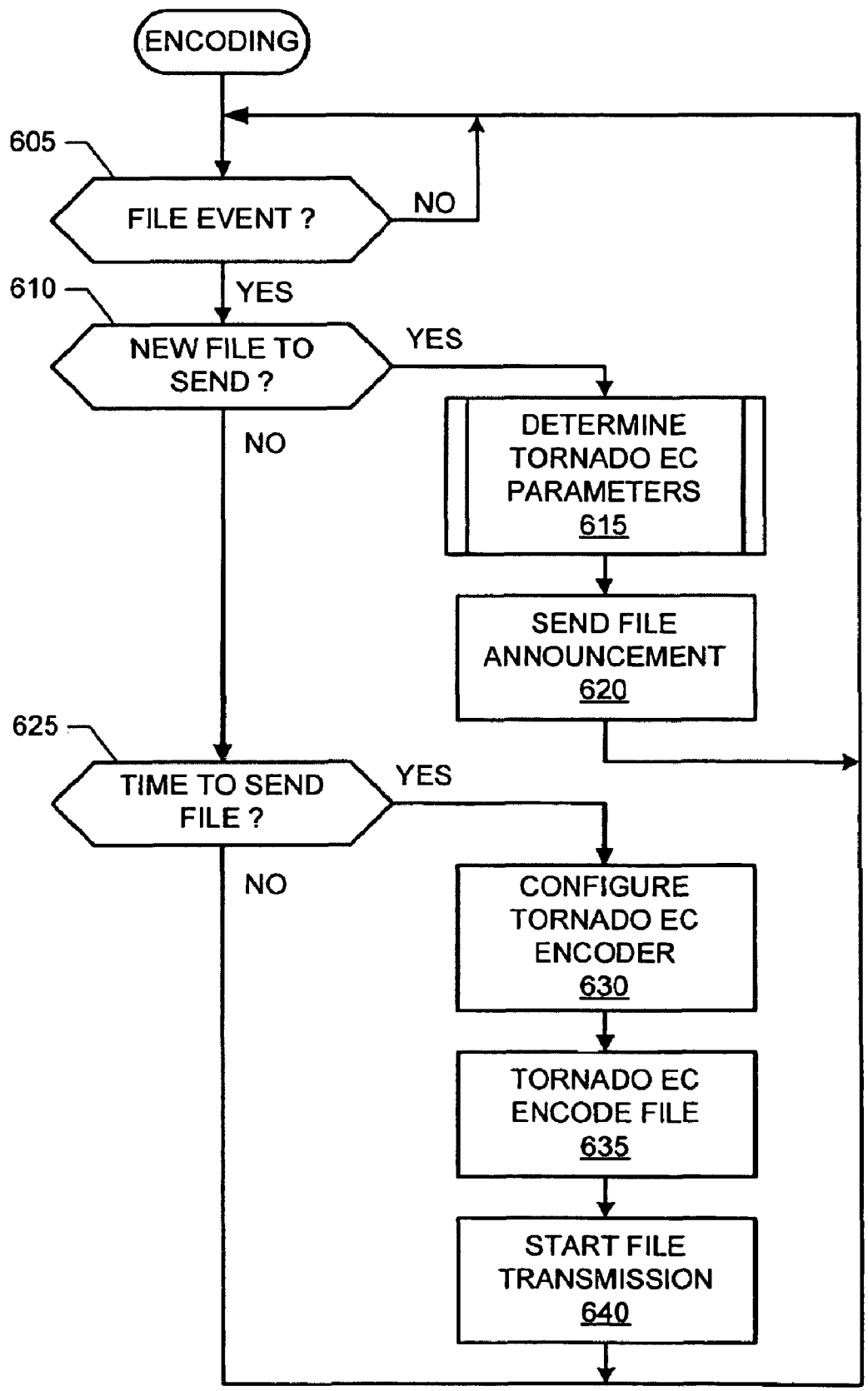
FIG. 6 is a flowchart representative of an example process that may be carried out to implement a portion of the example encoder of FIG. 5.

FIG. 6 illustrates a flowchart representative of an example process that may carried out to implement the example encoder 116 of FIGS. 1 and/or 5. The example process of FIG. 6 and/or, more generally, the example encoder 116 may be executed by a processor, a controller and/or any other suitable processing device. For example, the example process of FIG. 6 and/or, more generally, the example encoder 116 may be embodied in coded instructions stored on a tangible medium such as a flash memory, or RAM associated with a processor (e.g., the processor 8010 shown in the example processor platform 8000 and discussed below in conjunction with FIG. 16 and/or the processor 550 discussed above in connection with FIG. 5). Alternatively, some or all of the example process of FIG. 6 and/or, more generally, the example encoder 116 may be implemented using an application specific integrated circuit (ASIC), a programmable logic device (PLD), a field programmable logic device (FPLD), discrete logic, hardware, firmware, etc. Also, some or all of the example process of FIG. 6 and/or, more generally, the example encoder 116 may be implemented manually or as combinations of any of the foregoing techniques, for example, a combination of firmware and/or software and hardware. Further, although the example process of FIG. 6 are described with reference to the flowchart of FIG. 6, persons of ordinary skill in the art will readily appreciate that many other methods of implementing the example encoder 116 may be employed. For example, the order of execution of the blocks may be changed, and/or some of the blocks described may be changed, eliminated, subdivided, or combined.

The example process of FIG. 6 begins with the encoder 116 waiting for a file event to occur (block 605). Example file events include, but are not necessarily limited to, a new file for which a file announcement should be sent or a time at which a previously announced file is to be transmitted by the encoder 116. Persons of ordinary skill in the art will appreciate that file events may be queued and processed sequentially and/or processed in parallel by, for example, separate processing threads. If a file event occurs (block 605), the encoder 116 determines if a new file announcement is to be sent (block 610). If a new file announcement is to be sent (block 610), the processor 550 determines and/or selects Tornado EC parameters and/or selects a Tornado graph (block 615) by, for example, implementing an example process discussed below in connection with FIG. 15 (block 615). The processor 550 then creates and sends a file announcement message to the receivers 106 (block 620). The file announcement message may be formatted and/or transmitted using any of a variety of techniques. For instance, in the example DTH system 100 of FIG. 1, a file announcement message contains, among other things, (a) a multicast IP address by which the file will be transmitted, (b) a transmission start time, (c) a client identifier (e.g., a Tornado graph file download, a software download, a video store download, etc.), (d) a flag indicating if Tornado EC is enabled, and, if Tornado EC is enabled, (e) a Tornado graph identifier and a node_block_size. Control then returns to block 605 to await another file event.

Returning to block 610, if a new file announcement is not to be sent, the processor 550 determines if a time to send a data file has arrived (block 625). If the time to start transmission of a data file has arrived (block 625), the processor 550 configures the Tornado EC encoder 510 to encode the data file by, for example, configuring the Tornado EC encoder 510 to select one of a plurality of Tornado graphs from, for instance, the Tornado graph storage 555 and configuring the Tornado EC encoder 510 with a determined node_block_size (block 630). The Tornado EC encoder 510 then encodes the data file (block 635) and the encoder 116 transmits the Tornado EC encoded data file to the receivers 106 (block 640). Control then returns to block 605 to await another file event.

Figure 7:
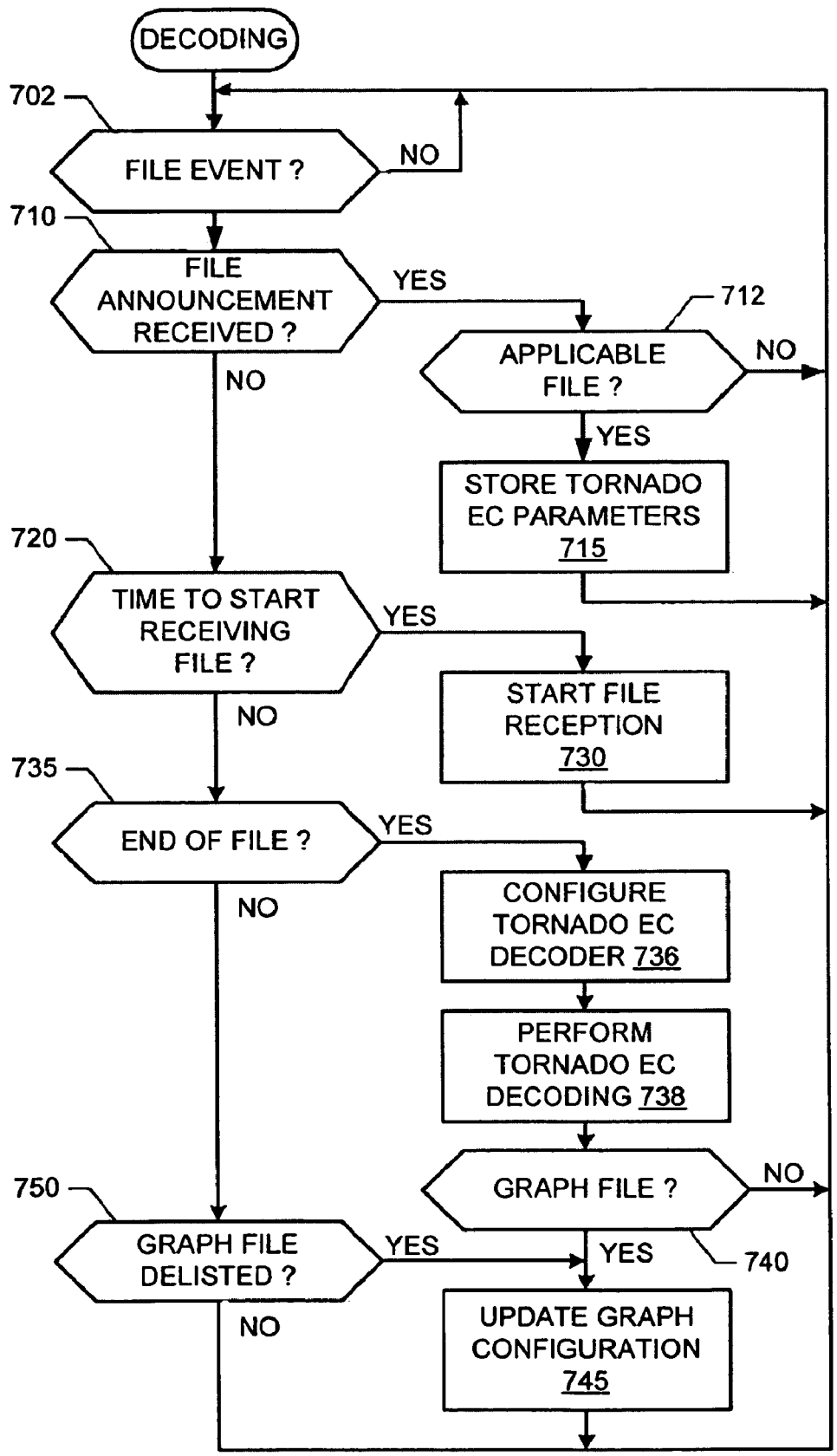
FIG. 7 is a flowchart representative of an example process that may be carried out to implement a portion of the example receiver of FIGS. 2 and/or 3.

FIG. 7 illustrates a flowchart representative of an example process that may be carried out to implement a portion of the example receiver stations 106 of FIGS. 1, 2 and 3. The example process of FIG. 7 and/or, more generally, the example receiver stations 106 may be executed by a processor, a controller and/or any other suitable processing device. For example, the example process of FIG. 7 and/or, more generally, the example receiver stations 106 may be embodied in coded instructions stored on a tangible medium such as a flash memory, or RAM associated with a processor (e.g., the processor 8010 shown in the example processor platform 8000 and discussed below in conjunction with FIG. 16 and/or the microprocessor 202 of FIG. 2). Alternatively, some or all of the example process of FIG. 7 and/or, more generally, the example receiver stations 106 may be implemented using an application specific integrated circuit (ASIC), a programmable logic device (PLD), a field programmable logic device (FPLD), discrete logic, hardware, firmware, etc. Also, some or all of the example process of FIG. 7 and/or, more generally, the example receiver stations 106 may be implemented manually or as combinations of any of the foregoing techniques, for example, a combination of firmware and/or software and hardware. Further, although the example process of FIG. 7 are described with reference to the flowchart of FIG. 7, persons of ordinary skill in the art will readily appreciate that many other methods of implementing the example receiver stations 106 may be employed. For example, the order of execution of the blocks may be changed, and/or some of the blocks described may be changed, eliminated, sub-divided, or combined.

The example process of FIG. 7 begins with a receiver station 106 waiting for a file event to occur (block 702). Example file events include, but are not necessarily limited to, receipt of a file announcement, a time to start receiving a new file, or receipt of the end of file, or a Tornado graph de-listing event. Persons of ordinary skill in the art will appreciate that file events may be queued and processed sequentially and/or processed in parallel by, for example, separate processing threads. If a file announcement is received (block 710), the receiver station 106 determines if the file is applicable to the receiver station 106, by, for example, examining one or more parameters associated with the file announcement. Example parameters of interest may include a client identifier, a file type identifier, a file name or identifier, a SCID, a PID, etc (block 712). If the file is not applicable to the receiver station 106 (block 712), control returns to block 702 to wait for another file event. If the file is applicable (block 712), the receiver station 106 extracts and stores, among other things, a Tornado EC graph selection and a node_block_size from the file announcement for use during reception of the file (block 715). Control then returns to block 702 to wait for another file event.

If the time to start receiving a file has arrived (block 720), the receiver station 106 begins reception and/or decoding of the file (block 730). Control then returns to block 702 to wait for another file event.

If the end of a file has occurred (block 735), the receiver station 106 configures the Tornado EC decoder with the stored Tornado graph selection and node_block_size (block 736). The Tornado EC decoder processes and/or corrects the received file (block 738). The receiver station 106 then determines if the processed and/or corrected file is a Tornado graph file (block 740). If the file is not a Tornado graph file (block 740), the receiver station 106 applies any of a variety of processing to the file. For example, the receiver may display a received video file for viewing by a user of the receiver station 106. If the file is a Tornado graph file (block 740), the receiver station 106 updates Tornado graph data stored in the receiver station 106 as discussed below in connection with FIGS. 8A-D (block 745). Control then returns to block 702 to wait for another file event.

If a Tornado graph file de-listing (e.g., a Tornado graph is no longer listed in a program guide listing) (block 750), the receiver station 106 updates the Tornado graph data stored in the receiver 130 as discussed below in connection with FIGS. 8A-D (block 745). Control then returns to block 702 to wait for another file event.

In the example DTH system 100 of FIG. 1, the transmitter station 102 and the receiver stations 106 may store one or more Tornado graphs in a non-volatile memory, for example, a flash memory device or a hard disk drive (HDD) when the transmitter station 102 or the receiver stations 106 are manufactured. In the illustrated system, the Tornado graphs stored in the receiver stations 106 may be updated and/or modified based upon Tornado graph data files received from, for example, the transmitter station 102. An example Tornado graph data storage table is discussed below in connection with FIG. 9 and may, for example, be stored in the System RAM 220 of FIG. 2.

Likewise, Tornado graphs stored in the Tornado graph storage 555 of FIG. 5 may be updated and/or modified using any of a variety of techniques. For example, an operator and/or administrator of the example DTH system 100 may load a new Tornado graph into the transmitter station 102, remove an existing Tornado graph, or change a parameter associated with an existing Tornado graph. The transmitter station 102 may automatically create and send one or more appropriate Tornado graph data files whenever a Tornado graph is updated, removed or modified. Alternatively, the operator and/or administrator creates the one or more Tornado graph data files and instructs the transmitter station 102 to transmit the one or more Tornado graph data files. An example Tornado graph data storage table is discussed below in connection with FIG. 9.

In the illustrated example of FIG. 1, client identifiers are used to distinguish files received by the receiver stations 106. For example, a client identifier of 0x0001 may be associated with a software download, a client identifier of 0x0004 may be associated with a general retail and/or digital video recorder (DVR) download, a client identifier of 0x1000 may be associated with a video store download, a client identifier of 0x0000 may be associated with a Tornado graph data file download, etc. By combining client identifiers with Tornado graphs, the example DTH system 100 can implement varying levels of Tornado error correction depending upon the client identifier and one or more parameters associated with a file (e.g., a file size, a transmission data rate, a business priority, etc.). In particular, each Tornado graph is associated with one or more client identifiers that may utilized the Tornado graph. In the example of FIG. 1, if no client identifier is associated with a Tornado graph, then all client identifiers may utilize the Tornado graph.

Figure 8A:
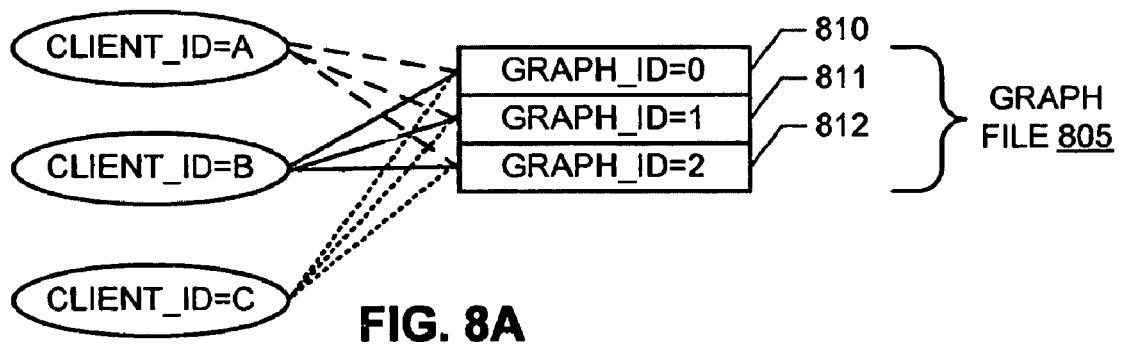
FIGS. 8A-8D illustrate example associations of client identifiers and Tornado error correction graphs.

FIGS. 8A-8D illustrate example associations of client identifiers and Tornado error correction graphs resulting from an example sequence of Tornado graph data files received by a receiver station 106. Starting with no Tornado graphs, FIG. 8A illustrates an example set of associations after the receiver station 106 receives a Tornado graph data file 805 containing 3 Tornado graphs 810, 811 and 812. Since the Tornado graph data file 805 specifies no client identifier(s), each of the graphs 810, 811 and 812 are associated with each of a set of supported client identifiers A, B and C. The receiver station 106 stores the graphs 810, 811 and 812 in a Tornado graph data storage implemented by the receiver station 106 for future reference.

Figure 8B:
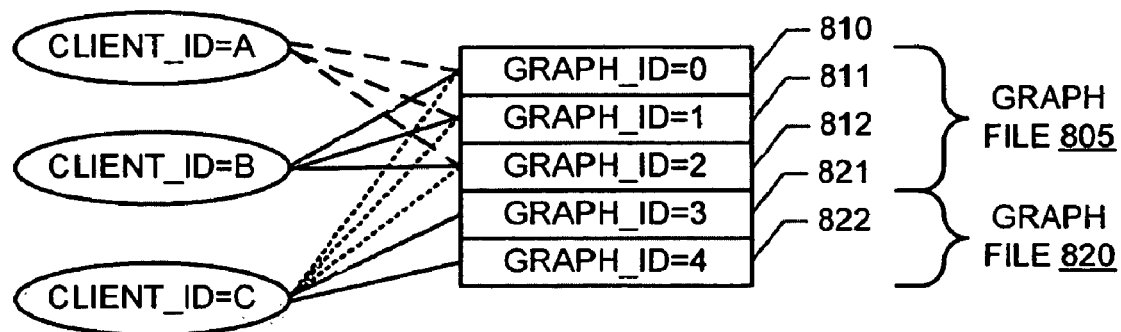
Figure 8C:
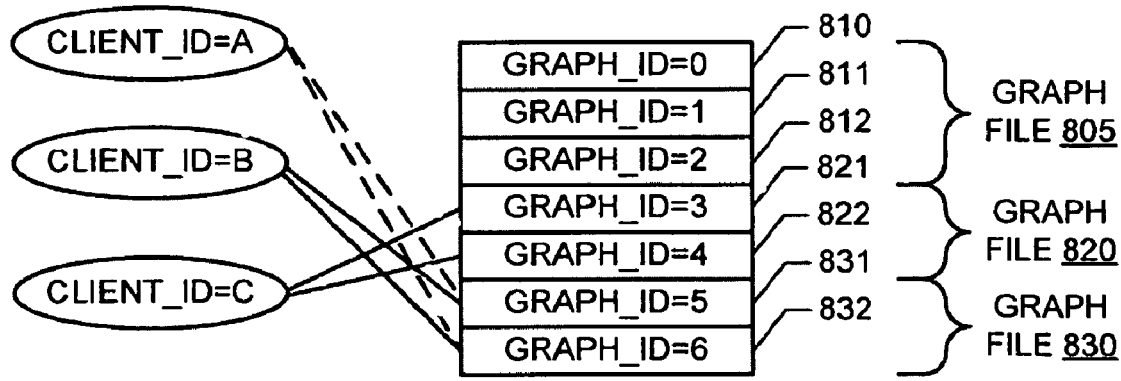
Figure 8D:
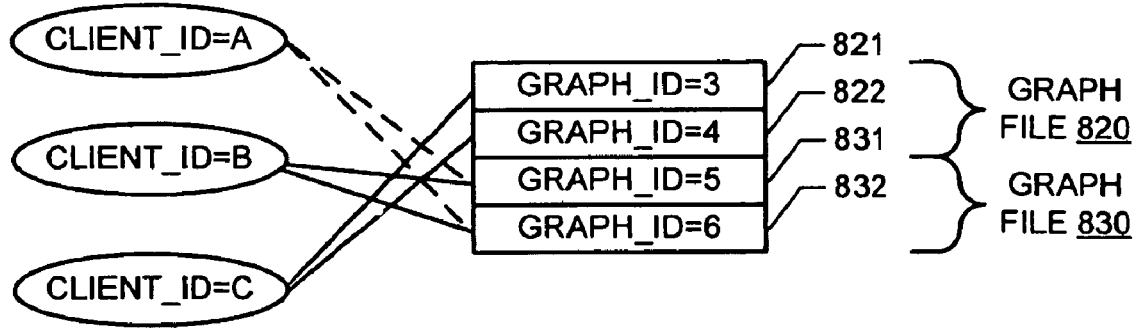

Upon receipt of a second Tornado graph data file 820 containing 2 Tornado graphs 821 and 822 and specifying the client identifier C, the receiver station 106 adds the new graphs 821 and 822 to the Tornado graph storage and updates the associations of Tornado graphs and client identifiers as shown in FIG. 8B. If the Tornado graph data file 805 is de-listed and then a third Tornado graph file 830 containing 2 Tornado graphs 831 and 832 is received and specifying the client identifiers A and B, the receiver station 105 stores the new graphs 831 and 832 in the Tornado graph storage, disassociates the Tornado graphs 810, 811 and 812 from the client identifiers, and adds the associations for the new graphs 831 and 832 as shown in FIG. 8C. The receiver station 106 then removes the Tornado graphs 810, 811 and 812 from the Tornado graph storage implemented by the receiver station 106 as illustrated in FIG. 8D. It will be readily apparent to persons of ordinary skill in the art that any configuration of Tornado graphs and client identifiers can be realized through an appropriate sequence of Tornado graph data files and/or Tornado graph data file de-listings.

FIG. 9 illustrates an example Tornado graph table 900 for storing Tornado graphs and associations between Tornado graphs and client identifiers by the transmitter station 102 and/or the receiver stations 106. It will be readily apparent to persons of ordinary skill in the art that any other table format and/or data structure may be used to store Tornado graphs and/or Tornado graph associations. The example table 900 illustrates the example associations, Tornado graphs 810, 811, 812, 821 and 822, and Tornado graphs files 805 and 820 of FIG. 8B and the example Tornado graph 410 of FIG. 4. A first column 905 of the example table 900 contains a list of the active Tornado graphs, a second column 910 indicates in which Tornado graph file the associated Tornado graph was received, and a third column 915 contains a list of client identifiers associated with the respective Tornado graph. If a client identifier entry is blank, then all client identifiers may utilize the respective Tornado graph. A fourth column 917 contains the Quality of Service (QoS) provided by the Tornado graph. QoS will be discussed in more detail below in connection with FIGS. 11 and 12.

The example table 900 also contains entries describing and/or specifying each Tornado graph. In particular, table column 920 specifies the number of Tornado graph columns contained in each Tornado graph. For example, the Tornado graph 810 corresponding to the Tornado graph 410 of FIG. 4 comprises three (3) Tornado graph columns, where the first Tornado graph column consists of the node A 422, the node B 424, the node C 426 and the node D 428 of FIG. 4. The example table 900 describes each of the non-input Tornado graph columns. For example, the example table 900 contains a table entry 925 specifying the number of nodes in the $2^{nd}$ Tornado graph column 445 and contains a plurality of entries specifying each node in the $2^{nd}$ Tornado graph column 445. For instance, table entry 930 specifies that node E 419 of FIG. 4 is connected with 4 links (i.e., graph edges) and table entry 935 specifies that node E 419 is linked to node A 422, node B 424, node C 426 and node D 428. The table entries 930 and 935 would be followed by similar entries to specify the remaining nodes of Tornado graph column 445. Likewise, the example table 900 specifies the $3^{rd}$ Tornado graph column 450 of FIG. 4. It will be readily apparent to persons of ordinary skill in the art that since each Tornado graph may have a different topology (e.g., different number of columns, different number of nodes per column, etc.) that each row of the table may contain a different number of entries. In one example, the table size is determined by the largest supported Tornado graph.

The performance and/or characteristics of a Tornado graph depend upon any of a variety of parameters associated with the Tornado graph and/or the communication path and/or channel over which Tornado encoded data will be transmitted. For instance, in the example DTH system 100 of FIG. 1, atmospheric conditions may cause an outage in the reception of data by the receiver stations 106 having a duration between two and five seconds and, thus, depending upon a broadcast data rate and node_block_size the number of nodes and/or data blocks lost due to an outage can be computed. An example table 1000 of values is illustrated in FIG. 10. As illustrated, depending upon broadcast data rate between 7 and 611 nodes can be lost due to an outage. If a file is small (e.g., 100 kilo bytes (KB)) and the broadcast data rate is large (e.g., 2 million bits per second (Mbps)) all the nodes in the file can be lost due to a 5 second outage, that is, 611 nodes*2048 bytes/node=1,251,328 bytes which is greater than the entire file. Thus, some files depending upon file size, data rate, node_block_size and/or outage duration a file may be unrecoverable.

In the illustrated example DTH system of FIG. 1, quality of service (QoS) is defined as the percentage of a file that can be recovered using Tornado EC when an outage and/or other noise and/or interference causes data corruption and/or loss. For example, a 20% QoS indicates that 20% of a file is recoverable with the currently selected Tornado graph and/or Tornado EC parameters (e.g., node_block_size). FIG. 11 illustrates an example table 1100 of QoS values resulting from various combinations of file size, outage duration and broadcast data rate for a node_block_size of 2048 bytes. As illustrated, QoS can vary from roughly 0% to 100%. Computing a similar table for a node_block_size of 1 byte and comparing it to the example table 1100 of FIG. 11 results in the example table 1200 of FIG. 12. As illustrated in the example table 1200, QoS may vary between 0.01% to 10% as a function of node_block_size. Additionally, small files (e.g., 10-20 KB) experience the largest QoS variation while large files (e.g., greater than 1 MB) vary by less than 1%.

In general, as illustrated in tables 1100 and 1200, QoS is a function of transmission data rate, outage duration and size of the encoded file. In particular, QoS for a file may be expressed mathematically as shown in EQN. 2, where $\lceil \ \rceil$ is the mathematical ceiling operator.

$$QoS = \frac{\text{number\_of\_nodes\_lost}}{\text{total\_number\_of\_nodes\_in\_file}} \qquad \text{EQN. 2}$$

$$= \frac{\lceil \text{data\_rate} * \text{outage\_duration} / \text{node\_block\_size} \rceil + 1}{\lceil (1 + \text{Tornado\_overhead}) * \lceil \text{file\_size} / \text{node\_block\_size} \rceil \rceil},$$

In the illustrated example of FIG. 1, the outage duration can be correlated with a business priority for a file, for instance, how important is it to deliver the file to a customer on the first attempt. For example, a file having a "high" business priority should be able to recover via Tornado EC from a 5 second outage, a file having a "medium" business priority should be able to recover from a 3.5 second outage, a file having a "low" business priority should be able to recover from a 2 second outage, and a file having "no" business priority does not require any Tornado EC. Persons of ordinary skill in the art will readily recognize that any set of correlations between any set of business priorities and any set of outage durations can be implemented. In the example encoder 116 of FIG. 5, the correlations between business priorities and outage durations are stored in the configuration data 560.

Based upon the business priority assigned to a file, the size of the file and the broadcast data rate, the QoS necessary for successful delivery of the file can be determined using, for example, the mathematical expression illustrated in EQN. 2. For example, a 640 KB file transmitted at a data rate of 400 thousand bits per second (kbps) with a "high" business priority requires a QoS of 39%. If the example system of FIG. 1 has a plurality of pre-determined Tornado graphs each have a respective achievable QoS, the transmitting station 102 can select the Tornado graph that best meets the QoS required for a file. For instance, if 8 Tornado graphs having respective QoS values of 5%, 10%, 15%, 20%, 25%, 30%, 35% and 40% are defined, then, for the example 640 KB file, the Tornado graph corresponding to a QoS of 40% will be selected.

Figure 13:
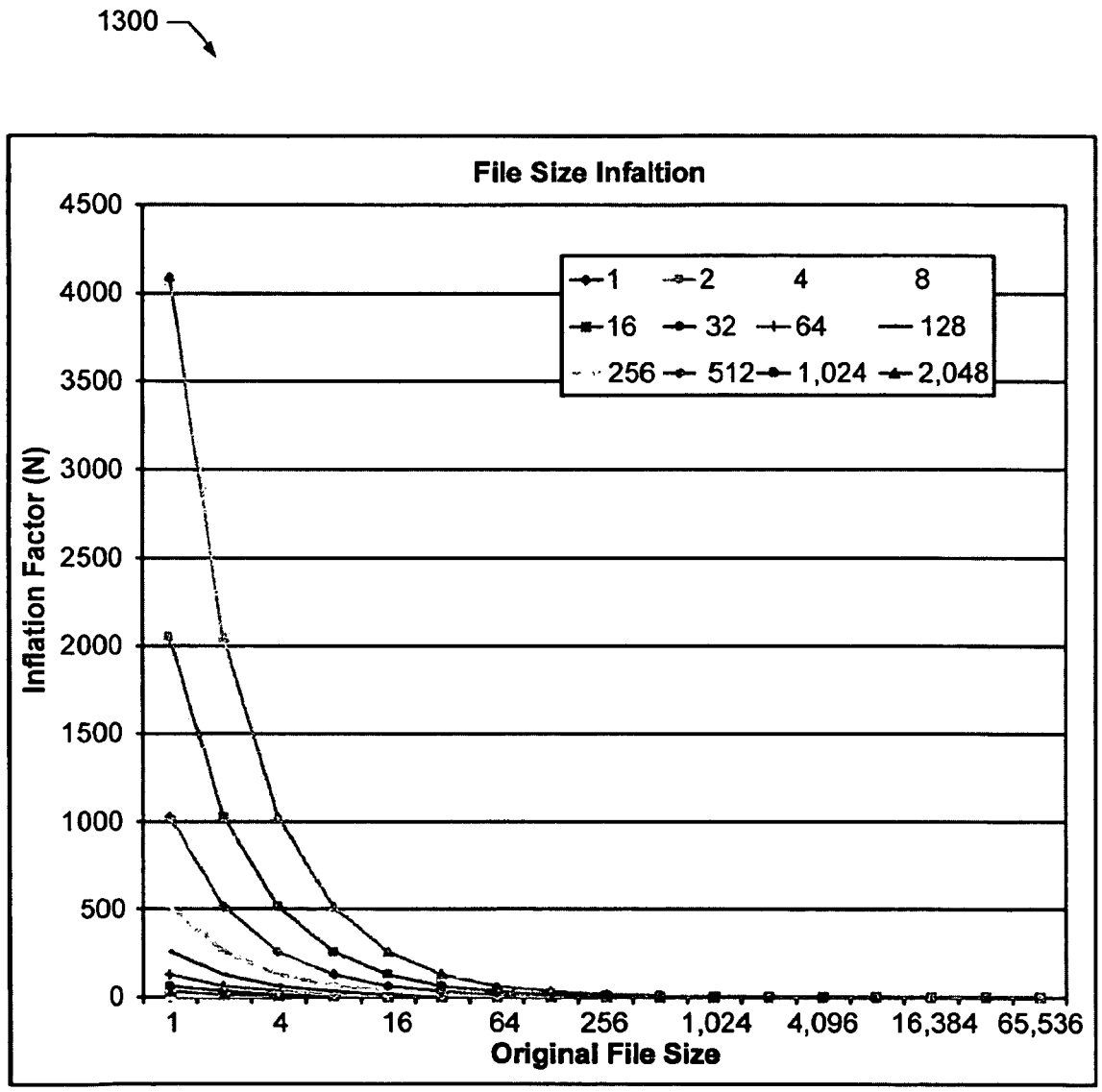
FIG. 13 illustrates an example table and graph showing a relationship between file size inflation and file size and/or node_block_size

The node_block_size used during Tornado EC encoding affects the resulting size of the encoded file. For example, if a (10*1024+1) byte file is encoded using a node_block_size of 2048 bytes with 512 nodes per graph column, the minimum encoded file size is 1 MB which represents a 100-fold increase in the size of the transmitted file (i.e., a file size inflation of 100). Alternatively, if a 10 byte node_block_size and 512 nodes per graph column were used, the resulting encode file is only 15 KB which represents an increase of only 50% (i.e., file size inflation of 1.5). FIG. 13 illustrates an example table 1300 and an example graph 1310 showing example relationships between file size inflation, file size and node_block_size. As illustrated in the graph 1310, as the file size increases the file size inflation factor approaches 1 for all node_block_size values. Likewise, for small files and small node_block_size values the file size inflation factor is also close to 1. However, for smaller files sizes and larger node_block_size values the inflation factor quickly increases and may become quite large.

It will be readily apparent to persons of ordinary skill in the art that depending upon the file size and the node_block_size that the number of blocks into which the file is divided will vary. For example, for a small file (e.g., 4 KB), 512 nodes per column and a node_block_size of 8 bytes there is only one block for the file. However, for a 32 KB file with 512 nodes per column and a node_block_size of 2 bytes there are 32 blocks.

For efficient encoded data file transmission, the node_block_size, the file size and the resultant number of blocks in the file should be balanced with the amount of overhead associated with the transmission of node header information. A typical implementation of a Tornado EC system includes 5 bytes of overhead per node and may result in an encoded file size growth factor of up to 500% of the original file size. For example, for a node_block_size of 1 byte, the 5 bytes of overhead represent 500% increase in the encoded file size, while for a node_block_size of 8 bytes the overhead only represents a 62.5% increase in the encoded file size.

For efficient file transmission, the node_block_size should be selected to, for example, balance the resultant file size inflation, the resultant number of blocks per file and the resultant percentage of node header information. For example, in the illustrated example of FIG. 1, a practical file size inflation is between 1 and 2, a practical number of blocks per file is greater than or equal to 4 to ensure some minimum amount of Tornado EC recoverability of the file, and less than 33% (i.e., factor less than 1.33) increase in encoded file size due to node header information. It will be readily apparent to persons of ordinary skill in the art that any combination of criteria may be implemented. For instance, the file size inflation could be allowed to be as large as 4. FIG. 14 illustrates an example table 1400 illustrating an example selection of node_block_size as a function of file size. For example, for a file size of 96 KB the example DTH system 100 would not utilize Tornado EC, while for a file size of 3000 KB the DTH system 100 would use a node_block_size of 64 bytes resulting in a file size inflation of 1, 16 blocks per file and a node overhead percentage of 10%. In particular, the processor 550 of FIG. 5 may utilize the example table 1400 to determine the node_block_size and whether or not to enable Tornado EC encoding. Alternatively, for files larger than 128 KB, the node_block_size (in bytes) can be computed from the file size (in KB) by, for example, using the mathematically expression shown in EQNS. 3-5, where $\lfloor \ \rfloor$ is the mathematical floor operator and $\lceil \ \rceil$ is the mathematical ceiling operator.

$$x = \lfloor \log_2(\text{file\_size}) + \frac{1}{2} \rfloor \qquad \text{EQN. 3}$$

$$y = \lceil x/2 + \frac{1}{2} \rceil \qquad \text{EQN. 4}$$

$$\text{node\_block\_size} = 2^y \qquad \text{EQN. 5}$$

Figure 15:
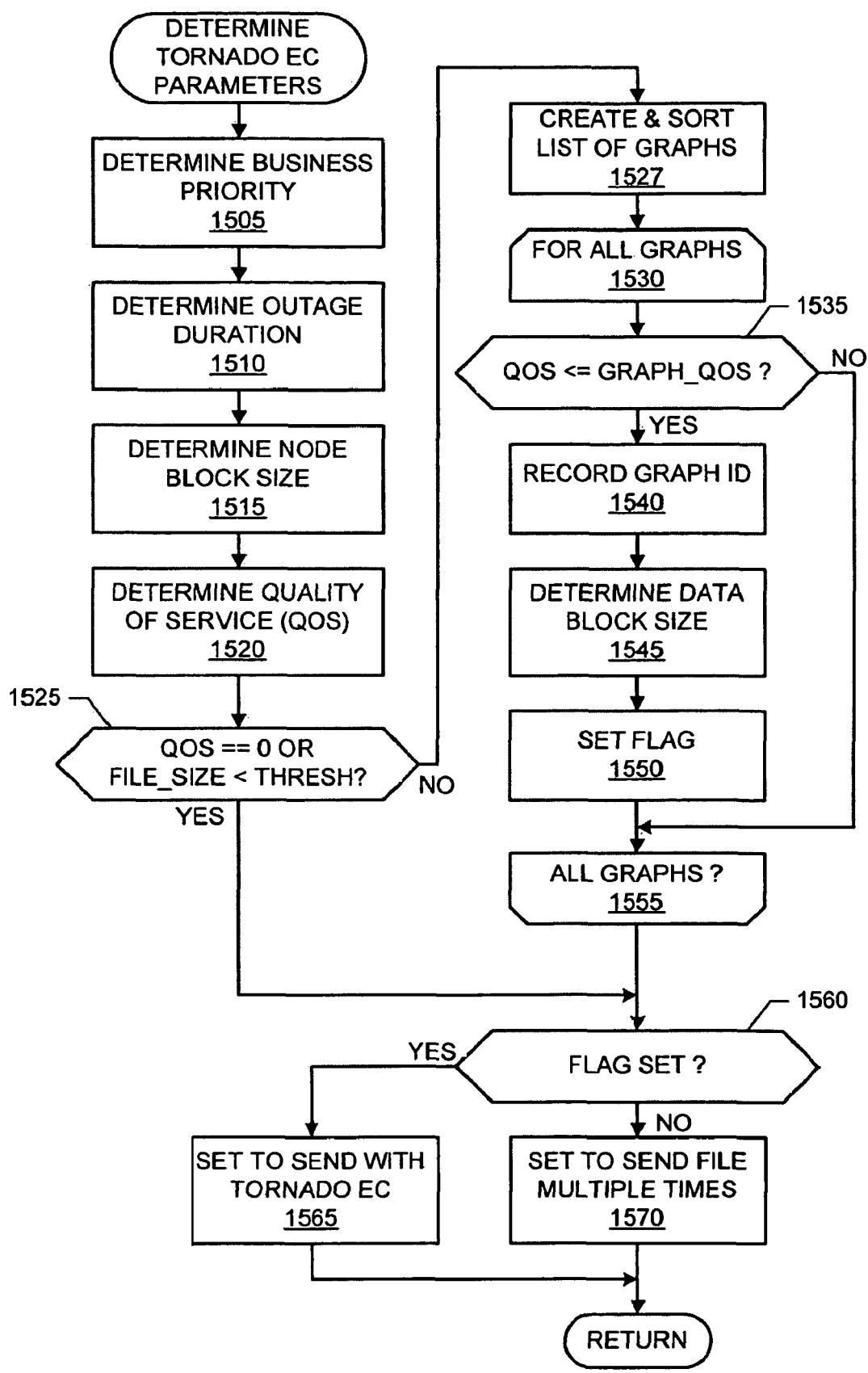
FIG. 15 is a flowchart representative of an example process that may be carried out to select Tornado error correction parameters.

FIG. 15 illustrates a flowchart representative of example process that may be carried out to select a Tornado graph and a node_block_size. The example process of FIG. 15 and/or, more generally, the example encoder 116 may be executed by a processor, a controller and/or any other suitable processing device. For example, the example process of FIG. 15 and/or, more generally, the example encoder 116 may be embodied in coded instructions stored on a tangible medium such as a flash memory, or RAM associated with a processor (e.g., the processor 8010 shown in the example processor platform 8000 and discussed below in conjunction with FIG. 15 and/or the processor 550 discussed above in connection with FIG. 5). Alternatively, some or all of the example process of FIG. 15 and/or, more generally, the example encoder 116 may be implemented using an application specific integrated circuit (ASIC), a programmable logic device (PLD), a field programmable logic device (FPLD), discrete logic, hardware, firmware, etc. Also, some or all of the example process of FIG. 15 and/or, more generally, the example encoder 116 may be implemented manually or as combinations of any of the foregoing techniques, for example, a combination of firmware and/or software and hardware. Further, although the example process of FIG. 15 are described with reference to the flowchart of FIG. 15, persons of ordinary skill in the art will readily appreciate that many other methods of implementing the example encoder 116 may be employed. For example, the order of execution of the blocks may be changed, and/or some of the blocks described may be changed, eliminated, subdivided, or combined.

The example process of FIG. 15 begins when the encoder 116 has a new file for which to select a Tornado graph and a node_block_size (block 610 of FIG. 6). The processor 550 determines the business priority (e.g., high, medium, low or none) for on the file by, for example, examining one or more parameters associated with the new file as provided by, for example, one of the data sources 108, 110, 112 or 114 (block 1505). Using the business priority for the file and the correlations between priorities and outage durations stored in the configuration data 560, the processor 550 determines the outage duration over which Tornado EC decoding should be able to successfully operate (block 1515). The processor 550 using, for example, the example table 1400 or EQNS. 3-5 then determines the appropriate node_block_size for the file (block 1510). Next, the processor 550 using, for example, EQN. 2 computes the required QoS for the file (block 1520).

If the required QoS is not equal to zero and the file size is greater than or equal to an a pre-determined threshold (e.g., the 128 KB threshold discussed above in connection with FIG. 14) (block 1525), the processor 550 creates a list of Tornado graphs based on the client identifier associated with the file and then sorts the list based on ascending value of Tornado graph QoS values (block 1527). For all Tornado graphs in the sorted list (block 1530), the processor 550 determines if the required QoS for the file is less than or equal to a Tornado graph QoS (block 1535). If the required QoS is less than or equal to the Tornado graph (block 1535), the processor 550 records the identifier of the Tornado graph (block 1540), determines the data block size into which the file will be divided (block 1545) and sets a flag indicating that Tornado EC will be enabled (block 1550). If the required QoS is greater than the Tornado graph (block 1535), the processor 550 determines if all Tornado graphs in the sorted list have been processed (block 1550). If not all Tornado graphs in the sorted list have been processed (block 1550), control returns to block 1530 to process the next Tornado graph. Else, control proceeds to block 1560.

Returning to block 1525, if the required QoS is equal to zero or the file size is less than the pre-determined threshold, then the flag will not be set.

If the flag is not set (block 1560) due to, for example, required QoS for the file equal to zero (block 1525), file size less than the pre-determined threshold (block 1525), or no Tornado graph selected (blocks 1530-1555), the encoder 116 will transmit the file without using Tornado EC encoding and/or send the file multiple times to ensure proper delivery (block 1570). If the flag is set (block 1560), then the processor 550 configures the Tornado EC encoder 510 with the selected Tornado graph and node_block_size (block 1565). Control then returns, for example, to the example process of FIG. 6 to send a file announcement (e.g., block 620 of FIG. 6).

Figure 16:
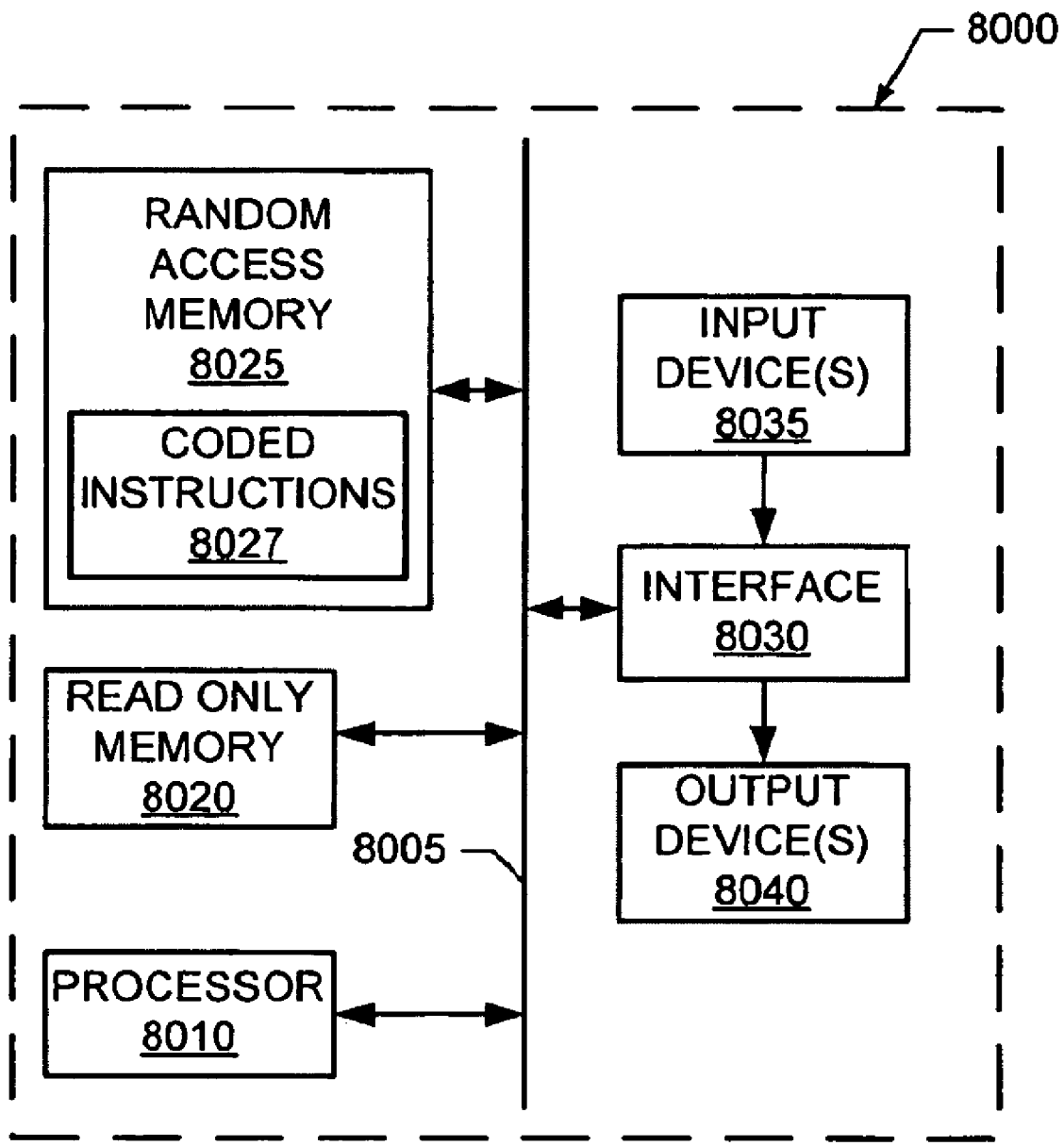
FIG. 16 is a schematic illustration of an example processor platform that may used and/or programmed to implement the example processes of FIGS. 5, 6, and/or 15.

FIG. 16 is a schematic diagram of an example processor platform 8000 that may be used and/or programmed to implement the example processes of FIGS. 6, 7 and 15 and/or, more generally, to select and/or utilize Tornado EC parameters in the example DTH system 100 of FIG. 1. For example, the processor platform 8000 can be implemented by one or more general purpose microprocessors, microcontrollers, etc.

The processor platform 8000 of the example of FIG. 16 includes a general purpose programmable processor 8010. The processor 8010 executes coded instructions 8027 present in main memory of the processor 8010 (e.g., within a RAM 8025). The processor 8010 may be any type of processing unit, such as a microprocessor from the Intel®, AMD®, IBM®, or SUN® families of microprocessors. The processor 8010 may implement, among other things, the example processes of FIGS. 6, 7 and 15 and/or selecting and/or utilizing Tornado EC parameters in the example DTH system 100 of FIG. 1.

The processor 8010 is in communication with the main memory (including a read only memory (ROM) 8020 and the RAM 8025) via a bus 8005. The RAM 8025 may be implemented by Synchronous DRAM (SDRAM), DRAM, and/or any other type of RAM device. The ROM 8020 may be implemented by flash memory and/or any other desired type of memory device. Access to the memory 8020 and 8025 is typically controlled by a memory controller (not shown) in a conventional manner.

The processor platform 8000 also includes a conventional interface circuit 8030. The interface circuit 8030 may be implemented by any type of well-known interface standard, such as an external memory interface, serial port, general purpose input/output, etc.

One or more input devices 8035 and one or more output devices 8040 are connected to the interface circuit 8030. The input devices 8035 and output devices 8040 may be used to implement interfaces between the transmitter station 102 and the receiver stations 106.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A system comprising
a transmitter station comprising:
a processor to select an error correction parameter based on an error correction configuration for a file, and
an error correction circuit to encode the file based on the selected error correction parameter.

2. The system of claim 1, further comprising assigning a value to the error correction parameter.

3. The system of claim 2, wherein the transmitter station transmits at least one of the error correction parameter and the value to a receiver station.

4. The system of claim 1, wherein the transmitter station is a satellite broadcast transmitter.

5. The system of claim 1, wherein the transmitter station further comprises:
a transport device, coupled to the processor; and
a modulator, coupled to the transport device, for converting the encoded data to a modulated waveform.

6. The system of claim 1, further comprising:
a receiver station comprising:
a processing device for receiving the error correction parameter; and
an error correction circuit, coupled to the processing device, for decoding a received file using the error correction parameter.

7. The system of claim 6, wherein the receiver station further comprises a memory, coupled to the processing device, for storing at least one error correction graphs.

8. The system of claim 7, wherein the received error correction parameter is used to select an error correction graph.

9. A method of error correction for a signal, comprising:
selecting a tornado error correction parameter based on a representative parameter for the signal, the representative parameter comprising a desired error correction characteristic;
encoding the signal using the tornado error correction parameter; and
transmitting the encoded signal.

10. The method of claim 9, wherein the desired error correction characteristic is at least one of a business priority, a file size, a broadcast data rate, a file size inflation factor, a number of blocks per file, and an amount of overhead.

11. The method of claim 10, further comprising assigning a value to the tornado error correction parameter.

12. The method of claim 11, further comprising transmitting at least one of the tornado error correction parameter and the value to a receiver station.

13. The method of claim 12, further comprising:
receiving at least one of the tornado error correction parameter and the value; and an error correction circuit, coupled to the processing device, for decoding a received file using at least one of the value and the tornado error correction parameter.

14. The method of claim 9, wherein transmission of the encoded signal is performed by a satellite broadcast transmitter.

15. The method of claim 9, further comprising:
converting the encoded signal into a modulated waveform prior to transmitting the encoded signal.

16. The method of claim 9, further comprising storing a plurality of tornado error correction graphs; and retrieving the selected tornado error correction parameter from at least one of the tornado correction graphs.

17. A system for reducing errors in received signals, comprising:
a memory for storing a plurality of error correction factors;
a processing device, coupled to the memory, for processing the received signals to determine an error correction factor used to encode the received signals and for retrieving the determined error correction factor from the plurality of error correction factors stored in the memory; and
an error correction circuit, coupled to the processing device, for decoding the received signals using on the determined error correction factor.

18. The system of claim 17, wherein the memory stores the plurality of error correction factors in graphical form.

19. The system of claim 17, wherein the processing device determines the error correction factor used to encode the received signals using a value associated with the error correction factor.

20. The system of claim 17, wherein the received signals are transmitted via a satellite broadcasting system.

* * * * *